(12) United States Patent
Itou

(10) Patent No.: US 11,670,747 B2
(45) Date of Patent: Jun. 6, 2023

(54) DISPLAY DEVICE HAVING CURVED HIGH AND LOW REFRACTIVE INDEX LAYERS

(71) Applicant: Japan Display Inc., Tokyo (JP)

(72) Inventor: Osamu Itou, Tokyo (JP)

(73) Assignee: Japan Display Inc., Tokyo (JP)

( * ) Notice: Subject to any disclaimer, the term of this patent is extended or adjusted under 35 U.S.C. 154(b) by 291 days.

(21) Appl. No.: 17/034,837

(22) Filed: Sep. 28, 2020

(65) Prior Publication Data

US 2021/0098665 A1    Apr. 1, 2021

(30) Foreign Application Priority Data

Oct. 1, 2019    (JP) .............................. JP2019-181533

(51) Int. Cl.
| | |
|---|---|
| H01L 33/58 | (2010.01) |
| G02B 5/02 | (2006.01) |
| H01L 27/12 | (2006.01) |
| H01L 25/075 | (2006.01) |
| G09G 3/32 | (2016.01) |

(52) U.S. Cl.
CPC ............ *H01L 33/58* (2013.01); *G02B 5/0236* (2013.01); *G02B 5/0263* (2013.01); *H01L 25/0753* (2013.01); *H01L 27/1214* (2013.01); *G09G 3/32* (2013.01); *G09G 2310/0267* (2013.01); *H01L 2933/0091* (2013.01)

(58) Field of Classification Search
CPC . H01L 33/58; H01L 25/0753; H01L 27/1214; H01L 2933/0091; G02B 5/0236
See application file for complete search history.

(56) References Cited

U.S. PATENT DOCUMENTS

| | | | |
|---|---|---|---|
| 2014/0300845 A1* | 10/2014 | Tamaki ............... | G02F 1/13394 349/65 |
| 2017/0213502 A1 | 7/2017 | Henry et al. | |
| 2020/0126477 A1 | 4/2020 | Henry et al. | |

FOREIGN PATENT DOCUMENTS

| | | |
|---|---|---|
| JP | 2002-040235 A | 2/2002 |
| JP | 2017-529557 A | 10/2017 |

* cited by examiner

*Primary Examiner* — Jay C Chang
*Assistant Examiner* — Mikka Liu
(74) *Attorney, Agent, or Firm* — Michael Best & Friedrich LLP

(57) ABSTRACT

According to an aspect, a display device includes: a substrate; a plurality of pixels provided to the substrate; a plurality of light emitting elements provided to the pixels; and a first light diffusion layer including a plurality of light diffusion structures and having a first surface and a second surface opposite to the first surface, the second surface facing the substrate with the light emitting elements interposed between the second surface and the substrate. The light diffusion structures each include a plurality of high refractive index layers and a plurality of low refractive index layers. The high refractive index layers and the low refractive index layers are alternately layered in a thickness direction of the first light diffusion layer. The high refractive index layers and the low refractive index layers are each curved and recessed in a direction from the first surface toward the second surface.

20 Claims, 24 Drawing Sheets

DISPLAY DEVICE HAVING CURVED HIGH AND LOW REFRACTIVE INDEX LAYERS

CROSS-REFERENCE TO RELATED APPLICATION

This application claims priority from Japanese Application No. 2019-181533, filed on Oct. 1, 2019, the contents of which are incorporated by reference herein in its entirety.

BACKGROUND

1. Technical Field

What is disclosed herein relates to a display device.

2. Description of the Related Art

Displays with micro light emitting diodes (micro LEDs) serving as display elements have recently attracted attention (refer to Japanese Translation of PCT International Application Publication No. 2017-529557 (JP-T-2017-529557), for example). A plurality of LEDs are mounted on an array substrate (or a driver backplane in JP-T-2017-529557). Japanese Patent Application Laid-open Publication No. 2002-40235 describes a volume hologram used for a reflective liquid crystal display element.

Such a display with micro LEDs is expected to provide a larger relative amount of light in a direction in which an observer highly frequently observes the displays, that is, in the normal direction of the array substrate. If the volume hologram to be applied for a liquid crystal display element is used for a display with LEDs serving as self-emitting elements without any change, the display property may possibly deteriorate.

SUMMARY

According to an aspect, a display device includes: a substrate; a plurality of pixels provided to the substrate; a plurality of light emitting elements provided to the pixels; and a first light diffusion layer including a plurality of light diffusion structures and having a first surface and a second surface opposite to the first surface, the second surface facing the substrate with the light emitting elements interposed between the second surface and the substrate. The light diffusion structures each include a plurality of high refractive index layers and a plurality of low refractive index layers. The high refractive index layers and the low refractive index layers are alternately layered in a thickness direction of the first light diffusion layer. The high refractive index layers and the low refractive index layers are each curved and recessed in a direction from the first surface toward the second surface.

DETAILED DESCRIPTION

Figure 1:
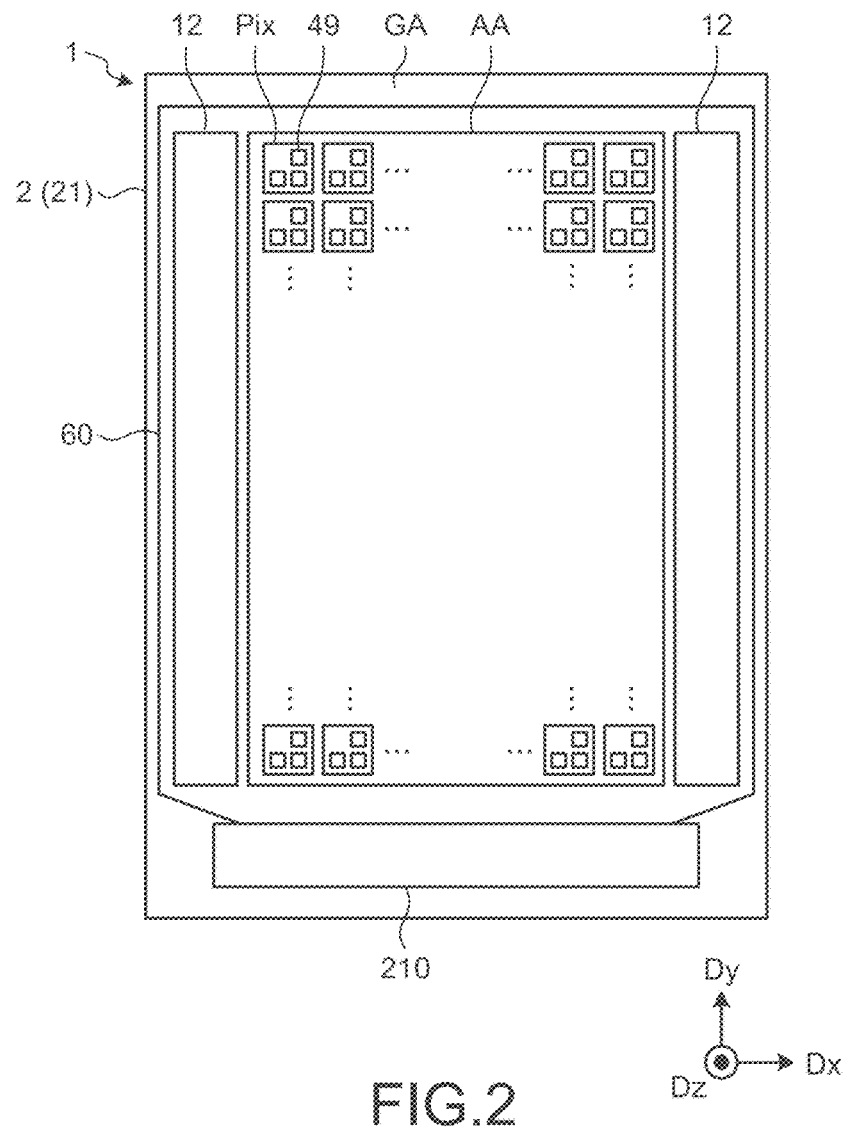
FIG. 1 is a plan view schematically illustrating a display device according to a first embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by the same reference numerals, and detailed explanation thereof may be appropriately omitted.

In the present specification and the accompanying claims, to express an aspect where a first structure is disposed on a second structure, the term "on" includes both of the following cases if not specially defined: the case where the first structure is disposed directly on the second structure so as to be in contact with the second structure and the case where the first structure is disposed on the second structure with another structure interposed therebetween.

1. First Embodiment

FIG. 1 is a plan view schematically illustrating a display device according to a first embodiment. As illustrated in FIG. 1, a display device 1 includes an array substrate 2, pixels Pix, drive circuits 12, a drive integrated circuit (IC) 210, and cathode wiring 60. The array substrate 2 is a drive circuit board for driving the pixels Pix and is also called a backplane or an active matrix substrate. The array substrate 2 includes a substrate 21, a plurality of transistors, a plurality of capacitances, and various kinds of wiring, for example.

As illustrated in FIG. 1, the display device 1 has a display region AA and a peripheral region GA. The display region AA is disposed overlapping the pixels Pix and displays an image. The peripheral region GA does not overlap the pixels Pix and is disposed outside the display region AA.

The pixels Pix are arrayed in a first direction Dx and a second direction Dy in the display region AA of the substrate 21. The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, planar view indicates the positional relation when viewed in the third direction Dz.

The drive circuits 12 drive a plurality of gate lines (e.g., a light emission control scanning line BG, a reset control scanning line RG, an initialization control scanning line IG, and a writing control scanning line SG (refer to FIG. 3)) based on various control signals received from the drive IC 210. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 210 is a circuit that controls display on the display device 1. The drive IC 210 is mounted on the peripheral region GA of the substrate 21 as a chip-on-glass (COG) IC. The mounting form of the drive IC 210 is not limited thereto, and the drive IC 210 may be mounted on FPCs or a rigid substrate coupled to the peripheral region GA of the substrate 21 as a chip-on-film (COF) IC.

The cathode wiring 60 is provided in the peripheral region GA of the substrate 21. The cathode wiring 60 is provided surrounding the pixels Pix in the display region AA and the drive circuits 12 in the peripheral region GA. Cathodes of a plurality of light emitting elements 3 are electrically coupled to the common cathode wiring 60 and supplied with a fixed potential (e.g., a ground potential). More specifically, a cathode terminal 32 (refer to FIG. 5) of the light emitting element 3 is coupled to the cathode wiring 60 via a cathode electrode 22.

Figure 2:
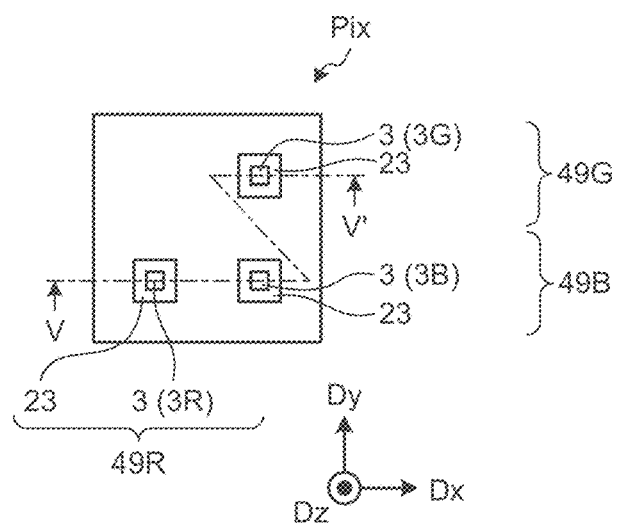
FIG. 2 is a plan view of a pixel.

FIG. 2 is a plan view of a pixel. As illustrated in FIG. 2, one pixel Pix includes a plurality of sub-pixels 49. The pixel Pix includes a first sub-pixel 49R, a second sub-pixel 49G, and a third sub-pixel 49B, for example. The first sub-pixel 49R displays a primary color of red as the first color. The second sub-pixel 49G displays a primary color of green as the second color. The third sub-pixel 49B displays a primary color of blue as the third color. As illustrated in FIG. 2, the first sub-pixel 49R and the third sub-pixel 49B in one pixel Pix are aligned in the first direction Dx. The second sub-pixel 49G and the third sub-pixel 49B are aligned in the second direction Dy. The first color, the second color, and the third color are not limited to red, green, and blue, respectively, and may be any desired colors, such as complementary colors. In the following description, the first sub-pixel 49R, the second sub-pixel 49G, and the third sub-pixel 49B are referred to as sub-pixels 49 when they need not be distinguished from one another.

The sub-pixels 49 each include the light emitting element 3 and an anode electrode 23. The display device 1 displays an image by emitting different light (e.g., red, green, and blue light) from light emitting elements 3R, 3G, and 3B in the first sub-pixel 49R, the second sub-pixel 49G, and the third sub-pixel 49B, respectively. The light emitting elements 3 are provided in the respective sub-pixels 49. The light emitting element 3 is a light emitting diode (LED) chip having a size of approximately 3 μm to 300 μm in planar view. An LED chip having a chip size smaller than 100 μm is called a micro LED, for example. The display device 1 including the micro LEDs in the respective pixels is also called a micro LED display device. The term "micro" of the micro LED is not intended to limit the size of the light emitting element 3.

The light emitting elements 3 may emit different light in four or more colors. The positions of the sub-pixels 49 are not limited to the configuration illustrated in FIG. 2. The first sub-pixel 49R, for example, may be adjacent to the second sub-pixel 49G in the first direction Dx. The first sub-pixel 49R, the second sub-pixel 49G, and the third sub-pixel 49B may be repeatedly arrayed in this order in the first direction Dx.

Figure 3:
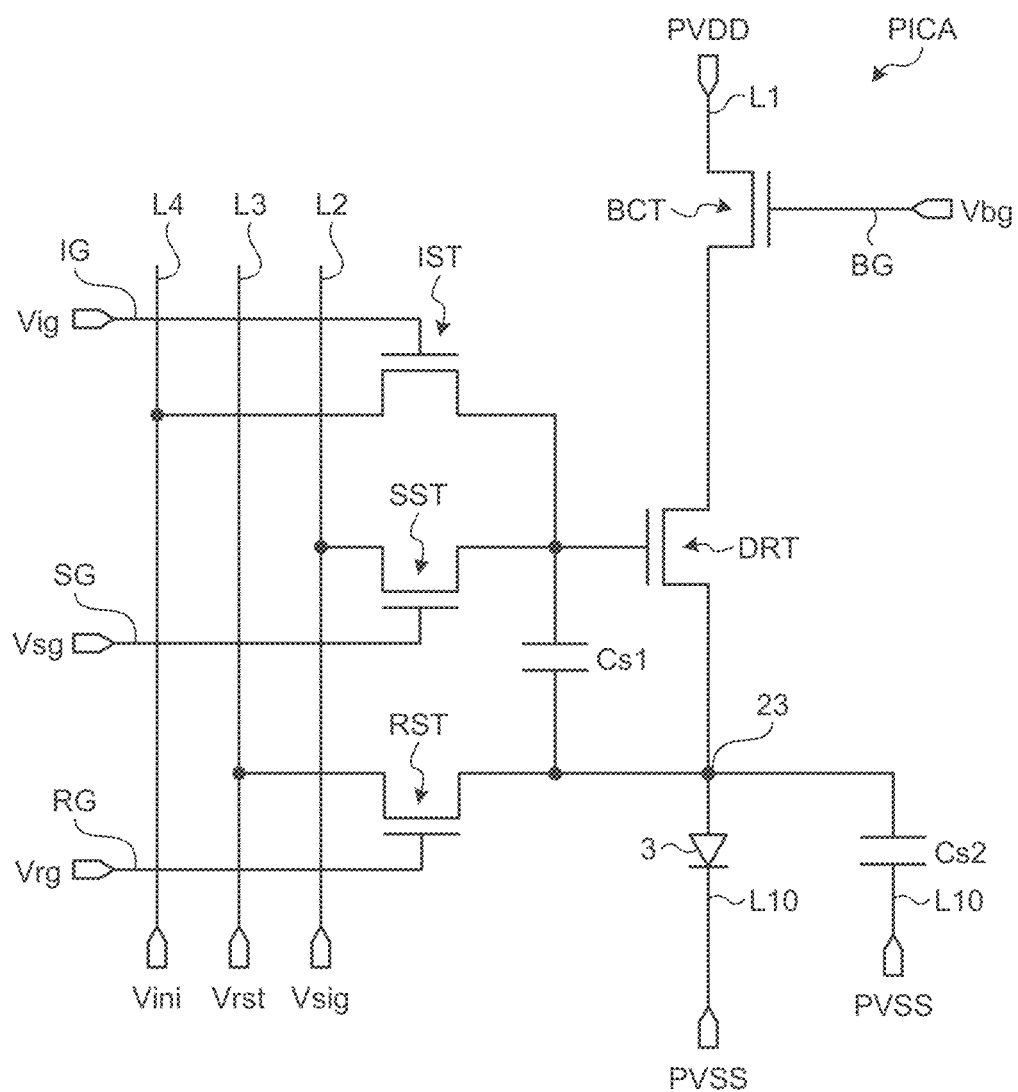
FIG. 3 is a circuit diagram of a pixel circuit.

FIG. 3 is a circuit diagram of a pixel circuit. A pixel circuit PICA illustrated in FIG. 3 is provided to each of the first sub-pixel 49R, the second sub-pixel 49G, and the third sub-pixel 49B. The pixel circuit PICA is provided on the substrate 21 to supply a drive signal (electric current) to the light emitting element 3. The explanation of the pixel circuit PICA with reference to FIG. 3 is applicable to the respective pixel circuits PICA included in the first sub-pixel 49R, the second sub-pixel 49G, and the third sub-pixel 49B.

As illustrated in FIG. 3, the pixel circuit PICA includes the light emitting element 3, five transistors, and two capacitances. Specifically, the pixel circuit PICA includes a light emission control transistor BCT, an initialization transistor IST, a writing transistor SST, a reset transistor RST, and a drive transistor DRT. Some of the transistors may be shared by adjacent sub-pixels 49 of the sub-pixels 49. The light emission control transistor BCT, for example, may be shared by three sub-pixels 49 via common wiring. The reset transistors RST may be provided in the peripheral region GA and provided for respective rows of the sub-pixels 49, for example. In this case, the reset transistor RST is coupled to the sources of a plurality of drive transistors DRT via common wiring.

The transistors included in the pixel circuit PICA are n-type thin-film transistors (TFTs). The present embodiment is not limited thereto, and the transistors may be p-type TFTs. To use p-type TFTs, the coupling form of power supply potential, capacitance Cs1, and capacitance Cs2 may be appropriately adapted.

The light emission control scanning line BG is coupled to the gate of the light emission control transistor BCT. The initialization control scanning line IG is coupled to the gate of the initialization transistor IST. The writing control scanning line SG is coupled to the gate of the writing transistor SST. The reset control scanning line RG is coupled to the gate of the reset transistor RST.

The light emission control scanning line BG, the initialization control scanning line IG, the writing control scanning line SG, and the reset control scanning line RG are coupled to the drive circuits 12 (refer to FIG. 1) provided in the peripheral region GA. The drive circuits 12 supply a light emission control signal Vbg, an initialization control signal Vig, a writing control signal Vsg, and a reset control signal Vrg to the light emission control scanning line BG, the initialization control scanning line IG, the writing control scanning line SG, and the reset control scanning line RG, respectively.

The drive IC 210 (refer to FIG. 1) supplies video signals Vsig to the respective pixel circuits PICA of the first sub-pixel 49R, the second sub-pixel 49G, and the third sub-pixel 49B in a time-division manner. A switching circuit, such as a multiplexer, is provided between each row of the first sub-pixels 49R, the second sub-pixels 49G, and the third sub-pixels 49B and the drive IC 210. The video signal Vsig is supplied to the writing transistor SST via a video signal line L2. The drive IC 210 supplies reset power supply potential Vrst to the reset transistor RST via a reset signal line L3. The drive IC 210 supplies initialization potential Vini to the initialization transistor IST via an initialization signal line L4.

The light emission control transistor BCT, the initialization transistor IST, the writing transistor SST, and the reset transistor RST each function as a switching element that selects electrical continuity and discontinuity between two nodes. The drive transistor DRT functions as an electric current control element that controls an electric current flowing through the light emitting element 3 depending on voltage between the gate and the drain.

The cathode (cathode terminal 32) of the light emitting element 3 is coupled to a cathode power supply line L10. The anode (anode terminal 33) of the light emitting element 3 is coupled to an anode power supply line L1 via the drive transistor DRT and the light emission control transistor BCT. The anode power supply line L1 is supplied with anode power supply potential PVDD. The cathode power supply line L10 is supplied with cathode power supply potential PVSS. The anode power supply potential PVDD is higher than the cathode power supply potential PVSS. The cathode power supply line L10 includes the cathode wiring 60. Light emission operations of the light emitting element 3 will be described later.

The pixel circuit PICA includes the capacitance Cs1 and the capacitance Cs2. The capacitance Cs1 is holding capacitance formed between the gate and the source of the drive transistor DRT. The capacitance Cs2 is additional capacitance formed between the cathode power supply line L10 and both the source of the drive transistor DRT and the anode of the light emitting element 3.

Figure 4:
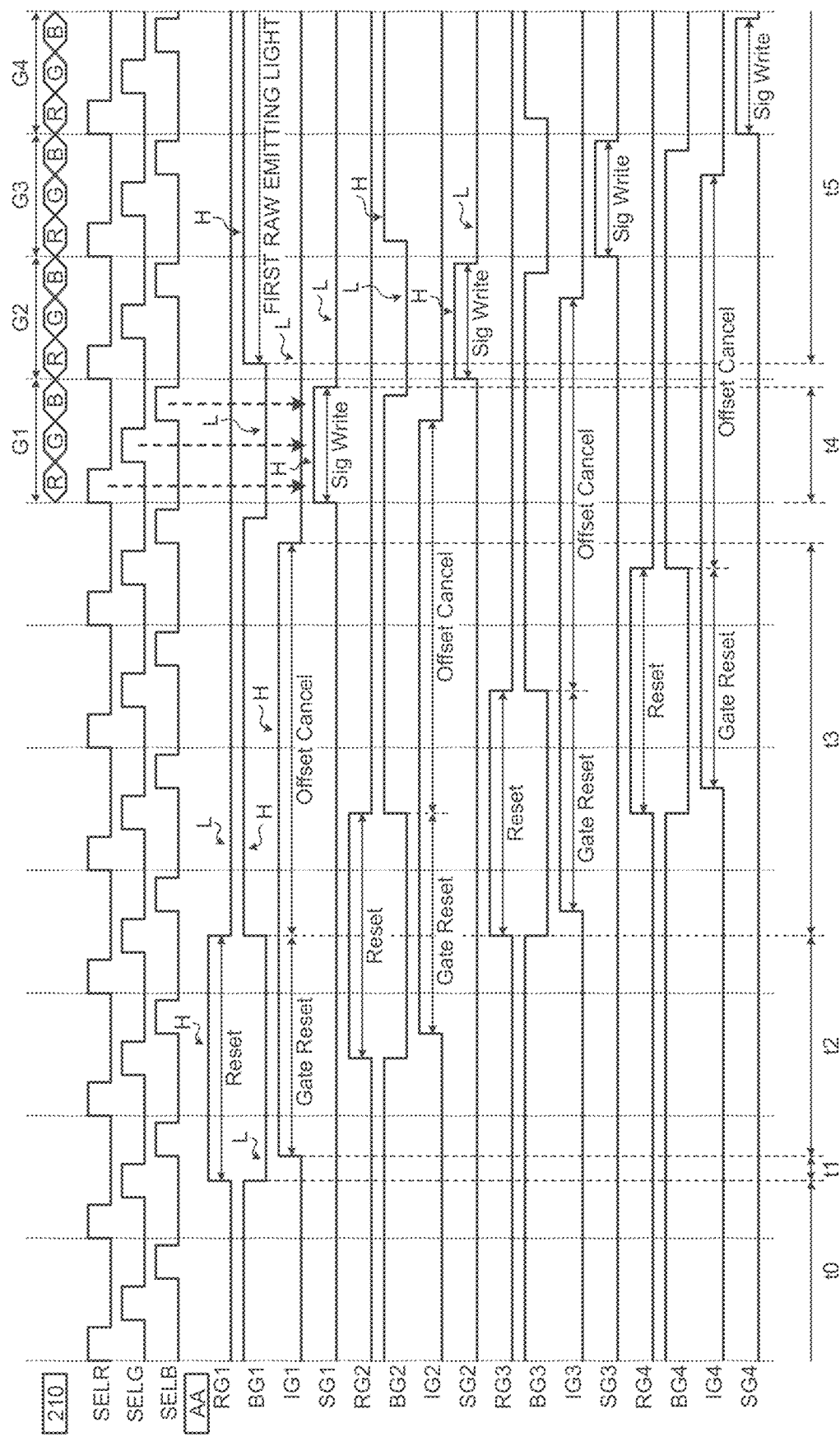
FIG. 4 is a timing chart of exemplary operations of the display device.

FIG. 4 is a timing chart of exemplary operations of the display device. Periods G1 to G4 illustrated in FIG. 4 each correspond to one horizontal period. While FIG. 4 illustrates the operations for driving the sub-pixels 49 of the first row to the sub-pixels 49 of the fourth row, the sub-pixels 49 of the fifth row to the sub-pixels 49 of the last row are subsequently driven. In the following description, a frame period 1F indicates the period for driving the sub-pixels 49 of the first row to the sub-pixels 49 of the last row.

The following describes exemplary operations from period t0 to period t5 illustrated in FIG. 4 in greater detail. The period t0 is a pervious frame light emission period. In other words, in the period t0 before processing in a certain frame period 1F is started, the sub-pixels 49 maintain the light emission state of the previous frame.

The subsequent period t1 is a source initialization period for the drive transistor DRT. Specifically, in the period t1, the electric potential of a light emission control scanning line BG1 is switched to an L (low) level, and the electric potential of a reset control scanning line RG1 is switched to an H (high) level by the control signals supplied from the drive circuits 12. As a result, the light emission control transistor BCT is turned off (electrically discontinuous state), and the reset transistor RST is turned on (electrically continuous state).

The light emission control scanning line BG1 indicates the light emission control scanning line BG coupled to the sub-pixels 49 of the first row. A light emission control scanning line BG2 indicates the light emission control scanning line BG coupled to the sub-pixels 49 of the second row. A light emission control scanning line BG3 indicates the light emission control scanning line BG coupled to the sub-pixels 49 of the third row. A light emission control scanning line BG4 indicates the light emission control scanning line BG coupled to the sub-pixels 49 of the fourth row. Similarly, other scanning lines, such as the reset control scanning lines RG1, RG2, RG3, and RG4, indicate the scanning lines of the respective rows.

In the period t1, an electric current from the anode power source line L1 is cut off by the light emission control transistor BCT in the sub-pixels 49 of the first row. Light emission from the light emitting elements 3 stops, and residual electric charges in the sub-pixels 49 flow outside through the reset transistor RST. As a result, the electric potential of the source of the drive transistor DRT is fixed at the reset power supply potential Vrst. The reset power supply potential Vrst is set so as to have a predetermined potential difference with respect to the cathode power supply potential PVSS. In this case, the potential difference between the reset power supply potential Vrst and the cathode power supply potential PVSS is less than the potential difference at which the light emitting element 3 starts to emit light.

The subsequent period t2 is a gate initialization period for the drive transistor DRT. Specifically, in the period t2, the electric potential of an initialization control scanning line IG1 is switched to the H level by the control signals supplied from the drive circuits 12. The initialization transistor IST is turned on. In the sub-pixels 49 belonging to the first row, the electric potential of the gate of the drive transistor DRT is fixed at the initialization potential Vini by the initialization transistor IST. The initialization potential Vini has an electric potential higher than a threshold of the drive transistor DRT with respect to the reset power supply potential Vrst. As a result, the drive transistor DRT is turned on. In the period t2, no electric current flows through the drive transistor DRT because the light emission control transistor BCT remains off.

The subsequent period t3 is an offset cancel operation period. Specifically, in the period t3, the electric potential of the light emission control scanning line BG1 is switched to the H level, and the electric potential of the reset control scanning line RG1 is switched to the L level by the control signals supplied from the drive circuits 12. As a result, the light emission control transistor BCT is turned on, and the reset transistor RST is turned off.

The drive transistor DRT is in the ON state by the operations performed in the period t2. As a result, an electric current is supplied to the drive transistor DRT from the anode power supply line L1 (anode power supply potential PVDD) via the light emission control transistor BCT.

At this stage, no electric current flows because voltage between the anode and the cathode of the light emitting element 3 is lower than light emission start voltage. Consequently, the source of the drive transistor DRT is charged by the anode power supply potential PVDD, whereby the electric potential of the source increases. The gate potential of the drive transistor DRT is the initialization potential Vini. When the source potential of the drive transistor DRT is equal to (Vini-Vth), the drive transistor DRT is turned off, and the increase in the electric potential stops. Vth indicates a threshold voltage Vth for the drive transistor DRT.

The threshold voltage Vth varies depending on the sub-pixels 49. Consequently, the source potential of the drive transistor DRT when the increase in the electric potential stops varies depending on the sub-pixels 49. In other words, voltage corresponding to the threshold voltage Vth of the drive transistor DRT is obtained in each of the sub-pixels 49 by the operations performed in the period t3. At this time, the light emitting element 3 is supplied with a voltage of ((Vini-Vth)-PUSS). No electric current flows through the light emitting element 3 because this voltage is lower than the light emission start voltage of the light emitting element 3.

The subsequent period t4 is a video signal writing operation period. Specifically, in the period t4, the electric potential of the light emission control scanning line BG1 is switched to the L level, the electric potential of the initialization control scanning line IG1 is switched to the L level, and the electric potential of a writing control scanning line SG1 is switched to the H level by the control signals supplied from the drive circuits 12.

As a result, the light emission control transistor BCT is turned off, the initialization transistor IST is turned off, and the writing transistor SST is turned on. In the period t4, the video signals Vsig are input to the gates of the drive transistors DRT in the sub-pixels 49 belonging to the first row. The gate potential of the drive transistor DRT changes from the initialization potential Vini to the electric potential of the video signal Vsig. By contrast, the source potential of the drive transistor DRT remains at (Vini-Vth). As a result, the voltage between the gate and the source of the drive transistor DRT is equal to (Vsig-(Vini-Vth)) and reflects variations in the threshold voltage Vth between the sub-pixels 49.

The video signal line L2 extends in the second direction Dy (refer to FIG. 1) and is coupled to the sub-pixels 49 of a plurality of rows belonging to the same column. Consequently, the period t4 for performing the video writing operation is carried out row by row.

The subsequent period t5 is a light emission operation period. Specifically, in the period t5, the electric potential of the light emission control scanning line BG1 is switched to the H level, and the electric potential of the writing control scanning line SG1 is switched to the L level by the control signals supplied from the drive circuits 12. As a result, the light emission control transistor BCT is turned on, and the writing transistor SST is turned off. An electric current is supplied to the drive transistor DRT from the anode power supply line L1 (anode power supply potential PVDD) via the light emission control transistor BCT.

The drive transistor DRT supplies, to the light emitting element 3, an electric current corresponding to the voltage between the gate and the source set until the period t4. The light emitting element 3 emits light at the luminance corresponding to the electric current. At this time, the voltage between the anode and the cathode of the light emitting element 3 is a voltage corresponding to the value of the voltage supplied via the drive transistor DRT. As a result, the electric potential of the anode of the light emitting element 3 increases. The voltage between the gate and the source of the drive transistor DRT is held by the capacitance Cs1. Consequently, the gate potential of the drive transistor DRT also increases in association with the increase in the electric potential of the anode of the light emitting element 3 due to coupling of the capacitance Cs1.

In an actual operation, the increase in the gate potential of the drive transistor DRT is slightly less than the increase in the electric potential of the anode because additional capacitance, such as the capacitance Cs2, is present in the gate of the drive transistor DRT besides the capacitance Cs1. Because this value is already known, the electric potential of the video signal Vsig can be determined so as to obtain a desired current value at the final voltage between the gate and the source of the drive transistor DRT.

After the operations described above are completed from the first row to the last row, an image of one frame is displayed. The reset operation for the sub-pixels 49 belonging to the second row is performed in a period overlapping the periods t2 and t3. The offset cancel operation for the sub-pixels 49 belonging to the second row is performed in a period overlapping the periods t3 and t4. The video signal writing operation for the sub-pixels 49 belonging to the second row is performed in a period overlapping the period t5. Subsequently, the operations described above are repeated, thereby displaying video.

While the sub-pixels 49 of one row are driven from the period t1 to the period t5 in the exemplary operations illustrated in FIG. 4, the present embodiment is not limited thereto. The drive circuits 12 may simultaneously drive the sub-pixels 49 of two rows or three or more rows.

The configuration of the pixel circuit PICA illustrated in FIG. 3 and the exemplary operations illustrated in FIG. 4 are given by way of example only and may be appropriately modified. The number of wiring lines and the number of transistors in one sub-pixel 49, for example, may be different from those described above. The pixel circuit PICA may have a configuration of a current mirror circuit, for example.

Figure 5:
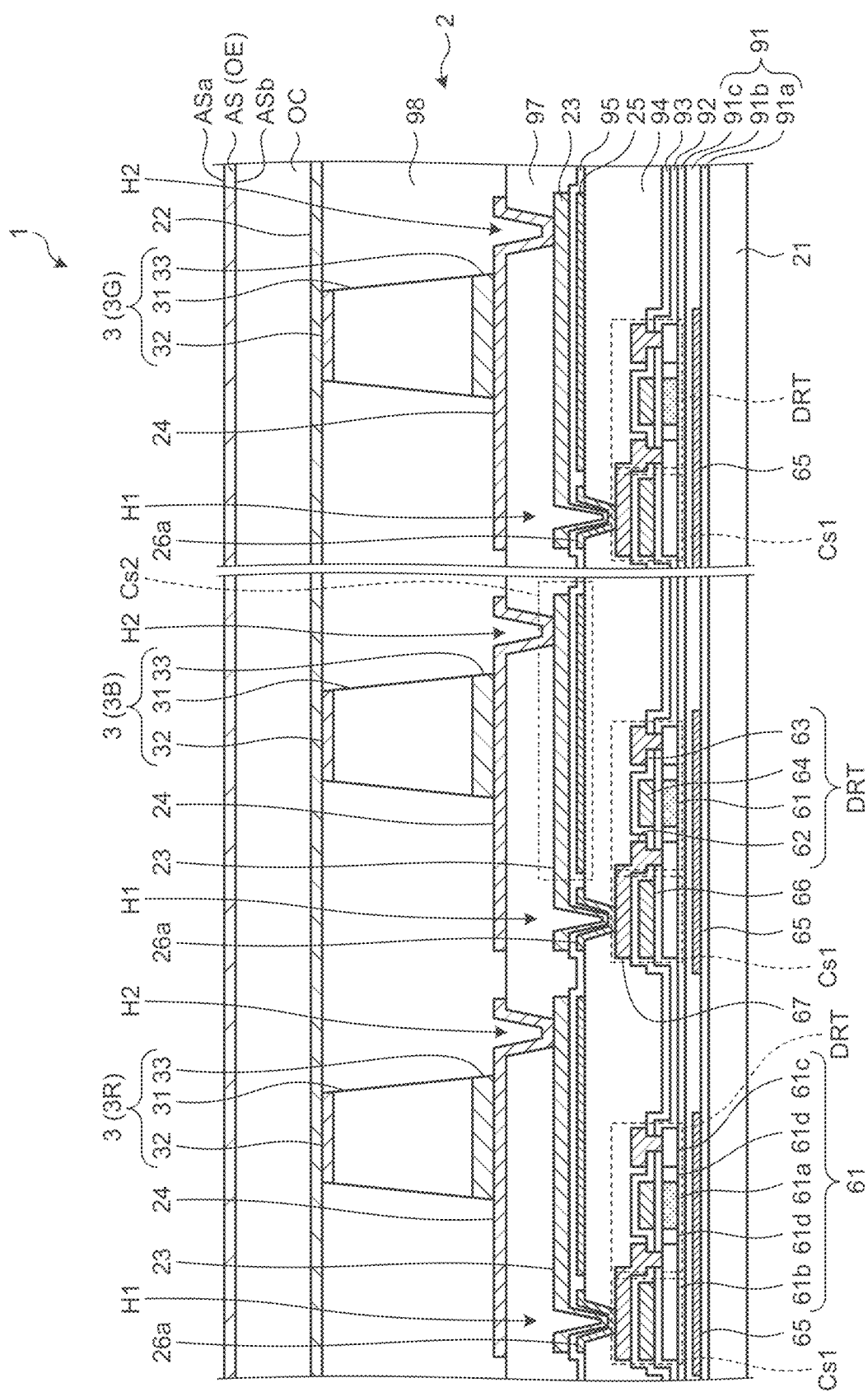
FIG. 5 is a cross-sectional view along line V-V' of FIG. 2.

The following describes a cross-sectional configuration of the display device 1. FIG. 5 is a cross-sectional view along line V-V' of FIG. 2. As illustrated in FIG. 5, the light emitting elements 3 are provided on the array substrate 2. The array substrate 2 includes the substrate 21, the anode electrodes 23, mounting electrodes 24, counter electrodes 25, coupling electrodes 26a, various transistors, various kinds of wiring, and various insulating films.

The substrate 21 is an insulating substrate and is a glass substrate made of quartz or non-alkali glass or a resin substrate made of polyimide, for example. If the substrate 21 is a flexible resin substrate, the display device 1 may be provided as a sheet display. The substrate 21 is not necessarily made of polyimide and may be made of other resin materials.

In the following descriptions, the direction from the substrate 21 toward the light emitting element 3 in the direction perpendicular to the surface of the substrate 21 is referred to as "on the upper side" or simply as "on". The direction from the light emitting element 3 toward the substrate 21 is referred to as "on the lower side" or simply as "under".

An undercoat film 91 is provided on the substrate 21. The undercoat film 91 has a three-layered structure including insulating films 91a, 91b, and 91c, for example. The insulating film 91a is a silicon oxide film, the insulating film 91b is a silicon nitride film, and the insulating film 91c is a silicon oxide film. The lower insulating film 91a is provided to improve adhesion between the substrate 21 and the undercoat film 91. The middle insulating film 91b is provided as a block film that restrains water and impurities from entering from outside. The upper insulating film 91c is provided as a block film that restrains hydrogen atoms contained in the silicon nitride film of the insulating film 91b from diffusing toward a semiconductor layer 61.

The structure of the undercoat film 91 is not limited to that illustrated in FIG. 5. The undercoat film 91 may be a single-layered film or a two-layered film, for example, or may be a multilayered film having four or more layers. If the substrate 21 is a glass substrate, the silicon nitride film may be formed directly on the substrate 21 because silicon nitride films have relatively high adhesion.

A light shielding film 65 is provided on the insulating film 91a. The light shielding film 65 is provided between the semiconductor layer 61 and the substrate 21. The light shielding film 65 can restrain light from entering into a channel region 61a of the semiconductor layer 61 from the substrate 21. Alternatively, the light shielding film 65 may be made of conductive material and supplied with a predetermined electric potential. As a result, the light shielding film 65 may have a back-gate effect on a drive transistor DRT. The light shielding film 65 may be provided on the substrate 21, and the insulating film 91a may be provided covering the light shielding film 65.

The drive transistor DRT is provided on the undercoat film 91. While the drive transistor DRT out of the transistors is illustrated in FIG. 5, the light emission control transistor BCT, the initialization transistor IST, the writing transistor SST, and the reset transistor RST included in the pixel circuit PICA also have the same multilayered structure as that of the drive transistor DRT.

The drive transistor DRT includes the semiconductor layer 61, a source electrode 62, a drain electrode 63, and a gate electrode 64. The semiconductor layer 61 is provided on the undercoat film 91. The semiconductor layer 61 is made of polysilicon, for example. The material of the semiconductor layer 61 is not limited thereto, and the semiconductor layer 61 may be made of a microcrystalline oxide semiconductor, an amorphous oxide semiconductor, or low-temperature polysilicon, for example. While only an n-type TFT is provided as the drive transistor DRT, a p-type TFT may be formed in addition to the n-type TFT. In the n-type TFT, the semiconductor layer 61 includes a channel region 61a, a source region 61b, a drain region 61c, and a low-concentration impurity region 61d. The low-concentration impurity region 61d is provided between the channel region 61a and the source region 61b and between the channel region 61a and the drain region 61c.

A gate insulating film 92 is provided on the undercoat film 91 to cover the semiconductor layer 61. The gate insulating film 92 is a silicon oxide film, for example. The gate electrode 64 is provided on the gate insulating film 92. First wiring 66 is provided in the same layer as the gate electrode 64. The gate electrode 64 and the first wiring 66 are made of molybdenum tungsten (MoW), for example. While the drive transistor DRT in the example illustrated in FIG. 5 has a top-gate structure in which the gate electrode 64 is provided on the upper side of the semiconductor layer 61, the structure of the drive transistor DRT is not limited thereto. The drive transistor DRT may have a bottom-gate structure in which the gate electrode 64 is provided on the lower side of the semiconductor layer 61 or a dual-gate structure in which the gate electrodes 64 are provided on both the upper side and the lower side of the semiconductor layer 61.

An interlayer insulating film 93 is provided on the gate insulating film 92 to cover the gate electrode 64. The interlayer insulating film 93 has a multilayered structure of a silicon nitride film and a silicon oxide film, for example. The source electrode 62 and the drain electrode 63 are provided on the interlayer insulating film 93. The source electrode 62 is coupled to the source region 61b through a contact hole formed in the gate insulating film 92 and the interlayer insulating film 93. The drain electrode 63 is coupled to the drain region 61c through a contact hole formed in the gate insulating film 92 and the interlayer insulating film 93. The source electrode 62 is coupled to second wiring 67 serving as routing wiring. The source electrode 62, the drain electrode 63, and the second wiring 67 may have a three-layered structure of titanium (Ti), aluminum (Al), and titanium (Ti), for example.

Part of the second wiring 67 is provided in a region overlapping the first wiring 66. The first wiring 66 and the second wiring 67 facing each other with the interlayer insulating film 93 interposed therebetween form capacitance Cs1. The first wiring 66 is provided in a region overlapping part of the semiconductor layer 61. The capacitance Cs1 includes capacitance formed by the semiconductor layer 61 and the first wiring 66 facing each other with the gate insulating film 92 interposed therebetween.

A first flattening film 94 is provided on the interlayer insulating film 93 to cover the drive transistor DRT and the second wiring 67. The first flattening film 94 is made of organic material, such as photosensitive acrylic. Organic material, such as photosensitive acrylic, is excellent in coverage property for difference in level of wiring as well as in surface flatness, compared with inorganic insulating material formed by CVD, for example.

The counter electrode 25, a capacitance insulating film 95, and the anode electrode 23 are layered in the order as listed, on the first flattening film 94. The counter electrode 25 is made of translucent conductive material, such as indium tin oxide (ITO). The coupling electrode 26a is provided in the same layer as the counter electrode 25. The coupling electrode 26a is provided covering the inside of a contact hole H1 formed in the first flattening film 94 and is coupled to the second wiring 67 at the bottom of the contact hole H1.

The capacitance insulating film 95 is provided covering the counter electrode 25 and the coupling electrode 26a and has an opening in a region overlapping the contact hole H1. The capacitance insulating film 95 is a silicon nitride film, for example. The anode electrode 23 faces the counter electrode 25 with the capacitance insulating film 95 interposed therebetween. The anode electrode 23 is electrically coupled to the coupling electrode 26a and the second wiring 67 through the contact hole H1. As a result, the anode electrode 23 is electrically coupled to the drive transistor DRT. The anode electrode 23 has a multilayered structure of Ti and Al. The material of the anode electrode 23 is not limited thereto, and the anode electrode 23 may be made of material including at least one of metals of Mo and Ti. Alternatively, the anode electrode 23 may be made of alloy including at least one of Mo and Ti or translucent conductive material.

Capacitance Cs2 is formed between the anode electrode 23 and the counter electrode 25 facing each other with the capacitance insulating film 95 interposed therebetween. The counter electrode 25 made of ITO also serves as a barrier film that protects various kinds of wiring, such as the second wiring 67, in forming the anode electrode 23. In patterning the anode electrode 23, the counter electrode 25 is partially exposed to etching environment. By annealing performed between formation of the counter electrode 25 and formation of the anode electrode 23, the counter electrode 25 has sufficient resistance to etching for the anode electrode 23.

A second flattening film 97 is provided on the anode electrode 23. The second flattening film 97 has a contact hole H2 reaching the anode electrode 23. The mounting electrode 24 is provided on the second flattening film 97 and electrically coupled to the anode electrode 23 through the contact hole H2. The mounting electrode 24 has a multilayered structure of Ti and Al like the anode electrode 23. The mounting electrode 24 may be made of conductive material different from that of the anode electrode 23.

The light emitting elements 3R, 3G, and 3B are mounted on the respective mounting electrodes 24. The light emitting elements 3 are each mounted such that the anode terminal 33 is in contact with the mounting electrode 24. Connection between the anode terminal 33 of the light emitting element 3 and the mounting electrode 24 is not particularly restricted as long as the connection can secure excellent electrical continuity between the anode terminal 33 and the mounting electrode 24 and does not damage objects formed on the array substrate 2. Examples of the method for connecting the anode terminal 33 and the mounting electrode 24 include, but are not limited to, reflowing using low-temperature melting soldering material, a method of placing the light emitting element 3 on the array substrate 2 with conductive paste interposed therebetween and burning and bonding them, etc.

The light emitting element 3 may be mounted directly on the anode electrode 23 without the second flattening film 97 or the mounting electrode 24 on the array substrate 2. Providing the second flattening film 97 and the mounting electrode 24 can restrain the capacitance insulating film 95 from being damaged by force applied in mounting the light emitting element 3. In other words, the second flattening film 97 and the mounting electrode 24 can restrain dielectric breakdown that would otherwise be caused between the anode electrode 23 and the counter electrode 25 that form the capacitance Cs2.

The light emitting element 3 includes a semiconductor layer 31, the cathode terminal 32, and the anode terminal 33. The semiconductor layer 31 is made of a compound semiconductor, such as gallium nitride (GaN) and aluminum indium phosphorous (AlInP). The semiconductor layer 31 may be made of different materials between on the light emitting elements 3R, 3G, and 3B. The active layer may have a multi-quantum well structure (MQW structure) in which well layers and barrier layers composed of several atomic layers are cyclically layered for high efficiency. The semiconductor layer 31 may be formed on a semiconductor substrate as the light emitting element 3. The light emitting element 3 is not necessarily mounted alone on the array substrate 2, and an LED chip including the light emitting element 3 may be mounted on the array substrate 2.

An element insulating film 98 is provided between the plurality of light emitting elements 3. The element insulating film 98 is made of resin material. The element insulating film 98 covers the side surfaces of each light emitting element 3, and the cathode terminal 32 of the light emitting element 3 is exposed from the element insulating film 98. The element insulating film 98 is flattened such that the upper surface of the element insulating film 98 and the upper surface of the cathode terminal 32 form a single plane. The position of the upper surface of the element insulating film 98 may be different from that of the upper surface of the cathode terminal 32.

The cathode electrode 22 covers the plurality of light emitting elements 3 and the element insulating film 98 and is electrically coupled to the light emitting elements 3. More specifically, the cathode electrode 22 is provided across the upper surface of the element insulating film 98 and the upper surface of the cathode terminal 32. The cathode electrode 22 is made of translucent conductive material, such as ITO. With this configuration, the light emitted from the light emitting elements 3 can be efficiently extracted to the outside. The cathode electrode 22 is electrically coupled to the cathode terminals 32 of the light emitting elements 3 mounted on the display region AA. The cathode electrode 22 is coupled to the cathode wiring 60 provided on the array substrate 2, at a cathode contact portion provided outside the display region AA.

An overcoat layer OC and an optical member OE are layered on the cathode electrode 22. The overcoat layer OC is a multilayered structure of a silicon nitride film having a thickness of 200 nm and an organic insulating film having a thickness of 10 μm. The optical member OE is an optical functional layer that scatters light emitted from the light emitting element 3 to shift the direction of the maximum of light emission distribution in the third direction Dz. The optical member OE includes a light diffusion layer AS. The light diffusion layer AS has a first surface ASa and a second surface ASb opposite to the first surface ASa. The second surface ASb of the light diffusion layer AS faces the substrate 21 (array substrate 2) with the plurality of light emitting elements 3 interposed therebetween. The optical member OE does not necessarily include one light diffusion layer AS and may include a plurality of light diffusion layers AS. The configuration of the optical member OE will be described later in greater detail.

Figure 6:
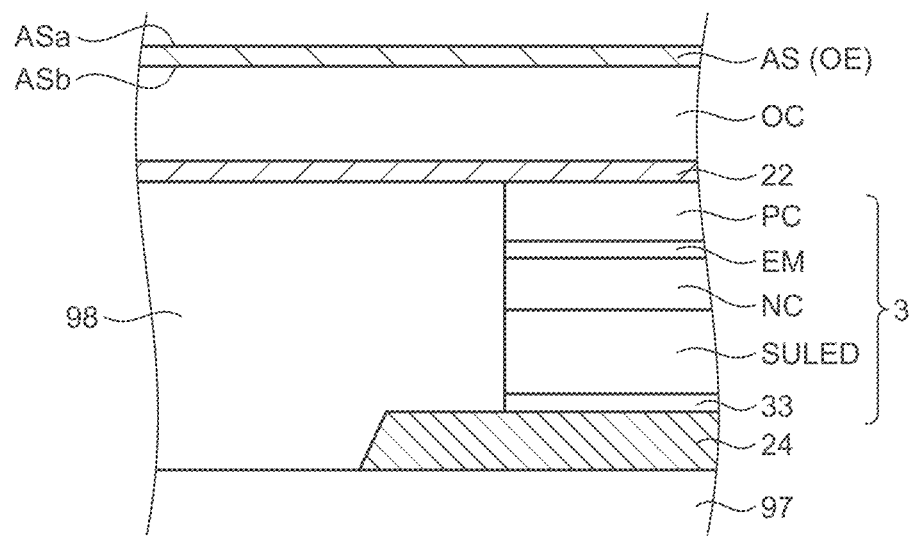
FIG. 6 is a partially enlarged cross-sectional view of a light emitting element illustrated in FIG. 5.

FIG. 6 is a partially enlarged cross-sectional view of the light emitting element illustrated in FIG. 5. As illustrated in FIG. 6, the light emitting element 3 includes a light emitting element substrate SULED, an n-type clad layer NC, a light emission layer EM, a p-type clad layer PC, and the anode terminal 33. The n-type clad layer NC, the light emission layer EM, and the p-type clad layer PC are layered in this order on the light emitting element substrate SULED. The anode terminal 33 is provided between the light emitting element substrate SULED and the mounting electrode 24.

In the light emitting element 3B that emits blue light, the light emission layer EM is made of indium gallium nitride (InGaN). The composition ratio of indium to gallium is 0.2:0.8, for example. The p-type clad layer PC and the n-type clad layer NC are made of gallium nitride (GaN). The light emitting element substrate SULED is made of silicon carbide (SiC).

In the light emitting element 3G that emits green light, the light emission layer EM is made of indium gallium nitride (InGaN). The composition ratio of indium to gallium is 0.45:0.55, for example. The p-type clad layer PC and the n-type clad layer NC are made of gallium nitride (GaN). The light emitting element substrate SULED is made of silicon carbide (SiC).

In the light emitting element 3R that emits red light, the light emission layer EM is made of aluminum gallium indium (AlGaIn). The composition ratio among aluminum, gallium, and indium is 0.225:0.275:0.5, for example. The p-type clad layer PC and the n-type clad layer NC are made of aluminum indium phosphide (AlInP). The light emitting element substrate SULED is made of gallium arsenide (GaAs).

The anode terminals 33 of the light emitting elements 3R, 3G, and 3B are made of aluminum. The maximum emission wavelengths of the light emitting elements 3R, 3G, and 3B are 645 nm, 530 nm, and 450 nm, respectively.

As described above, the display device 1 with the light emitting elements 3 serving as display elements is provided. The display device 1 may include a circularly polarizing plate, a cover glass, a touch panel, and other components on the upper sides of the cathode electrode 22 and the optical member OE as needed. In this case, a filler made of resin or the like may be provided between the display device 1 and the member, such as a cover glass. The display device 1 does not necessarily have a face-up structure in which the upper part of the light emitting element 3 is coupled to the cathode electrode 22. The display device 1 may have what is called a face-down structure in which the lower part of the light emitting element 3 is coupled to the anode electrode 23 and the cathode electrode 22.

The following describes distribution of light emitted from the light emitting element 3. A refractive index $n_{LED}$ of the light emitting element 3 is 2.4, for example. A refractive index $n_{CD}$ of the cathode electrode 22 disposed close to the upper part of the light emitting element 3 is 1.9, for example. A refractive index $n_{OC}$ of the overcoat layer OC is 1.5, for example. The refractive indexes $n_{CD}$ and $n_{OC}$ are lower than the refractive index $n_{LED}$.

Consequently, the traveling direction of light emitted from the light emitting element 3 is directed in an oblique direction inclining with respect to the third direction Dz when the light is passing through the cathode electrode 22 and the overcoat layer OC. The component of light having a large incident angle may possibly be totally reflected on the interface between the light emitting element 3 and the cathode electrode 22 and travel in a direction parallel to the array substrate 2. As described above, the light emitting element 3 has a high refractive index $n_{LED}$, thereby making it difficult to extract light to the outside, and the relative amount of light may possibly be smaller especially in the normal direction of the substrate 21 (third direction Dz) than on the high polar angle side (refer to FIG. 9).

Figure 7:
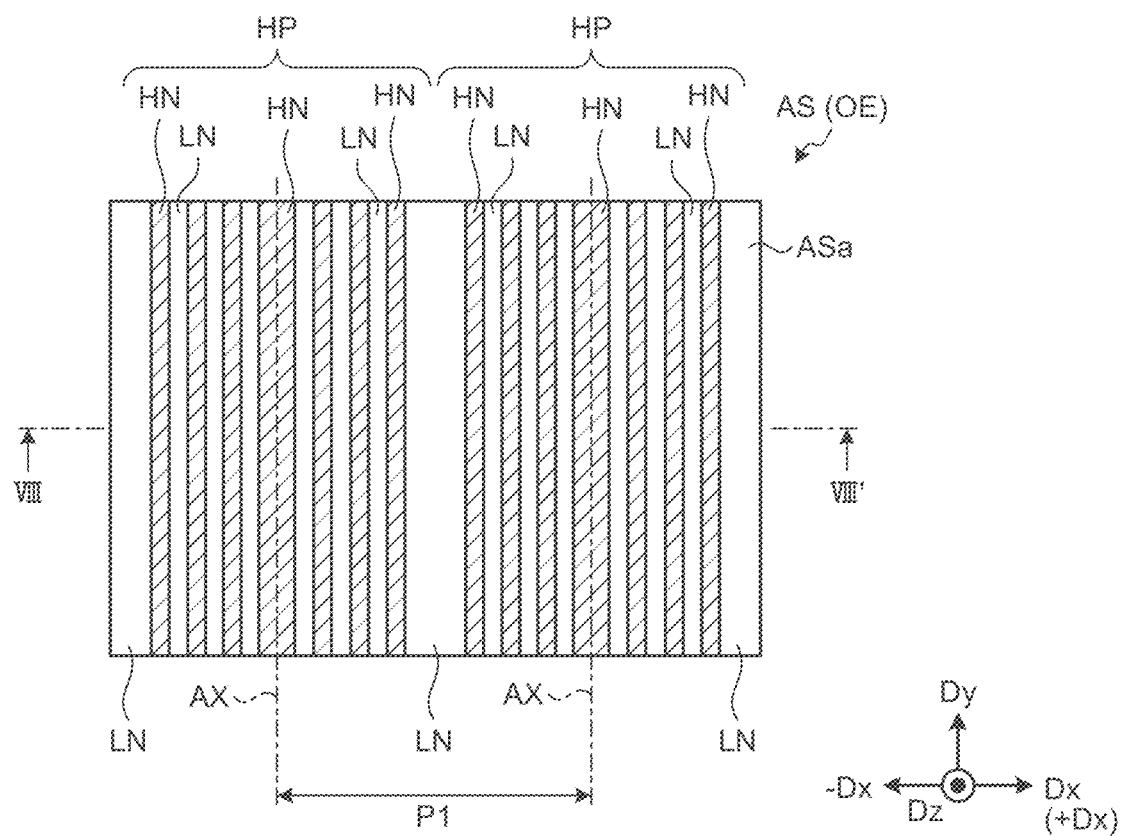
FIG. 7 is a plan view schematically illustrating a light diffusion layer included in an optical member according to the first embodiment.

The following describes the configuration of the optical member OE in greater detail. FIG. 7 is a plan view schematically illustrating the light diffusion layer included in the optical member according to the first embodiment. The light diffusion layer AS is a sheet-like member that scatters light. As illustrated in FIG. 7, the light diffusion layer AS includes a plurality of first light diffusion structures HP. The first light diffusion structures HP extend in the second direction Dy as a whole and are arranged in the first direction Dx.

The first light diffusion structure HP includes high refractive index layers HN and low refractive index layers LN. In other words, the first surface ASa of the light diffusion layer AS includes the high refractive index layers HN and the low refractive index layers LN in a mixed manner. Specifically, the high refractive index layers HN and the low refractive index layers LN constituting the first light diffusion structure HP have a concentric semicylindrical structure. A central axis AX of the concentric semicylindrical structure is positioned on the first surface ASa of the light diffusion layer AS and extends in the second direction Dy.

In the first light diffusion structure HP, the high refractive index layers HN and the low refractive index layers LN are alternately arrayed in the first direction Dx on the first surface ASa of the light diffusion layer AS. The high refractive index layers HN and the low refractive index layers LN each extend in the second direction Dy. More specifically, the high refractive index layer HN is provided overlapping the central axis AX, and the high refractive index layers HN and the low refractive index layers LN are alternately disposed from the central axis AX in the first direction Dx, like the high refractive index layer HN, the low refractive index layer LN, the high refractive index layer HN, . . . and the high refractive index layer HN. The high refractive index layers HN and the low refractive index layers LN are line-symmetrically disposed about the central axis AX.

The high refractive index layer HN and the low refractive index layer LN have different refractive indexes. The refractive index of the high refractive index layer HN is higher than that of the low refractive index layer LN. In other words, the high refractive index layer HN is a region having a relatively high refractive index in the light diffusion layer AS. The low refractive index layer LN is a region having a relatively low refractive index in the light diffusion layer AS.

The outermost periphery of the first light diffusion structure HP is formed of the high refractive index layer HN. The space between the first light diffusion structures HP disposed adjacent to each other is provided with the low refractive index layer LN. The width in the first direction Dx of the low refractive index layer LN provided between the first light diffusion structures HP is greater than the width in the first direction Dx of each of the high refractive index layers HN and the low refractive index layers LN constituting the first light diffusion structure HP. The present embodiment is not limited thereto, and the width in the first direction Dx of the low refractive index layer LN provided between the first light diffusion structures HP may be substantially equal to the width in the first direction Dx of each of the high refractive index layers HN and the low refractive index layers LN constituting the first light diffusion structure HP.

While two first light diffusion structures HP are illustrated in FIG. 7 to facilitate the reader's understanding, the light diffusion layer AS includes a large number of first light diffusion structures HP. The width of one first light diffusion structure HP in the first direction Dx is less than the width of one light emitting element 3 in the first direction Dx, for example. An arrangement pitch P1 between the first light diffusion structures HP disposed adjacent to each other in the first direction Dx is less than the width of one light emitting element 3 in the first direction Dx. In other words, a plurality of first light diffusion structures HP are arrayed overlapping one light emitting element 3. With this configuration, the light diffusion layer AS can satisfactorily scatter light emitted from the light emitting element 3 independently of the positional relation with the light emitting element 3. In other words, the optical member OE (light diffusion layer AS) need not be precisely positioned with respect to the light emitting element 3 when being layered on the array substrate 2.

In the present specification, the arrangement pitch P1 is the arrangement gap between the central axes AX in the first direction Dx of the arrayed first light diffusion structures HP. The first light diffusion structure HP may continuously extend in the second direction Dy from one end to the other end of the display region AA. Alternatively, a plurality of first light diffusion structures HP having a predetermined length in the second direction Dy may be arrayed in the second direction Dy.

Figure 8:
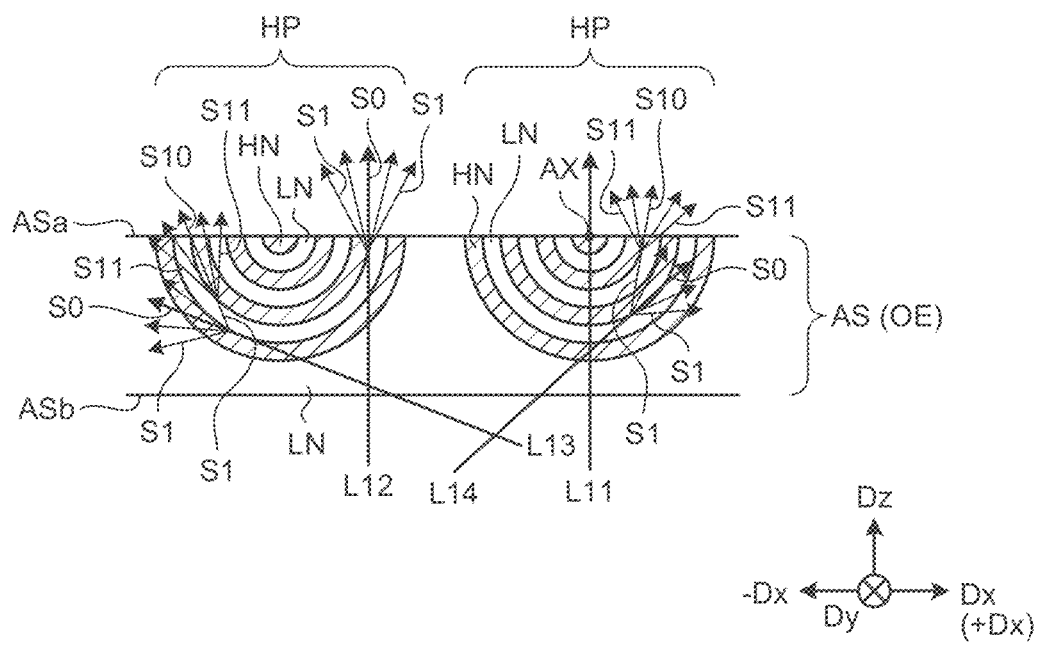
FIG. 8 is a cross-sectional view along line VIII-VIII' of FIG. 7.

FIG. 8 is a cross-sectional view along line VIII-VIII' of FIG. 7. As illustrated in FIG. 8, the high refractive index layers HN and the low refractive index layers LN in the first light diffusion structure HP are alternately layered in the thickness direction (third direction Dz) of the light diffusion layer AS. The high refractive index layers HN and the low refractive index layers LN are each curved and recessed in a direction from the first surface ASa toward the second surface ASb.

More specifically, the central axis AX is positioned on the first surface ASa of the light diffusion layer AS, and the high refractive index layers HN and the low refractive index layers LN are alternately and repeatedly layered in a concentric semicylindrical shape about the central axis AX. The "concentric semicylindrical shape" according to the present embodiment indicates a semicylindrical structure on a cross section orthogonal to the central axis AX obtained by alternately and concentrically layering the high refractive index layers HN and the low refractive index layers LN about the same central axis AX and cutting the cylindrical structure, which extends along the central axis AX, along a plane along the central axis AX. In other words, the curved high refractive index layers HN and the curved low refractive index layers LN are alternately layered such that their radii increase as they are away from the central axis AX.

The high refractive index layer HN positioned in the outermost layer of the first light diffusion structure HP does not reach the second surface ASb. The gap between the outermost high refractive index layer HN and the second surface ASb in the third direction Dz is provided with the low refractive index layer LN.

With the different refractive indexes of the high refractive index layer HN and the low refractive index layer LN, the light diffusion layer AS has a property of scattering light traveling in a specific incident direction. In other words, the light diffusion layer AS scatters light traveling in an incident direction within a range of approximately ±20° with respect to the interface between the high refractive index layer HN and the low refractive index layer LN. The light diffusion layer AS does not scatter light traveling in an incident direction out of the range of ±20° with respect to the interface between the high refractive index layer HN and the low refractive index layer LN and causes the light to pass therethrough.

Specifically, light L11 travels in the third direction Dz and passes through the central axis AX. In other words, the light L11 travels in an incident direction of approximately 90° with respect to the interface between the high refractive index layer HN and the low refractive index layer LN and is not scattered by the first light diffusion structure HP. Light L12 travels in the third direction Dz and passes through a position deviated in the first direction Dx (+Dx direction) from the central axis AX. The light L12 travels in an incident direction within the range of approximately ±20° with respect to the interface between the high refractive index layer HN and the low refractive index layer LN on the first surface ASa (upper surface) of the light diffusion layer AS. Consequently, the light L12 is scattered by the first light diffusion structure HP. A scattering central axis S0 of the light L12 extends in the third direction Dz, and scattered light S1 is produced about the scattering central axis S0.

By contrast, light L13 travels in a direction inclining in the −Dx direction with respect to the third direction Dz. The light L13 travels in an incident direction out of the range of approximately ±20° with respect to the interface between the high refractive index layer HN and the low refractive index layer LN on the outer periphery of the first light diffusion structure HP. Part of the scattered light S1 of the light L13 is directed in the third direction Dz with respect to the scattering central axis S0. The components of light directed in the third direction Dz in the scattered light S1 travels in an incident direction within the range of approximately ±20° with respect to the interface between the high refractive index layer HN and the low refractive index layer LN on the first surface ASa of the light diffusion layer AS. As a result, the scattered light S1 is further scattered, and scattered light S11 is produced about a scattering central axis S10. The scattered light S11 is produced within an angular range including the third direction Dz.

Light L14 is incident on the light diffusion layer AS at an inclination angle opposite to the angle of the light L13. In other words, the light L14 travels in a direction inclining in the +Dx direction with respect to the third direction Dz. In a manner similar to the light L13, the light L14 is scattered by the first light diffusion structure HP a plurality of times. The scattered light S11 scattered on the first surface ASa of the light diffusion layer AS is produced within an angular range including the third direction Dz.

As described above, the light diffusion layer AS mainly scatters light the azimuth angle of which is the first direction Dx. The high refractive index layers HN and the low refractive index layers LN according to the present embodiment have a concentric semicylindrical structure about the central axis AX. With this configuration, the inclination angle of the interface between the high refractive index layer HN and the low refractive index layer LN varies depending on the position in the first direction Dx and the position in the third direction Dz. As a result, light incident at a high polar angle is scattered by the first light diffusion structure HP a plurality of times, and part of the components of the incident light is directed to the low polar angle side (third direction Dz). Compared with the case where the interface between the high refractive index layer HN and the low refractive index layer LN is linearly provided, the angle formed by the interface between the high refractive index layer HN and the low refractive index layer LN and the incident direction of light varies depending on the position in one first light diffusion structure HP. Consequently, the light diffusion layer AS can scatter incident light falling within a wider angular range.

The scattering central axes S0 and S10 are axes about which the anisotropic scattering properties of incident light are substantially symmetrical. In other words, the scattering central axes S0 and S10 extend in the incident direction of the most scattered light. Angles formed by the axial directions of the scattering central axes S0 and S10 and the normal direction (third direction Dz) of the surface of the light diffusion layer AS are referred to as polar angles of the scattering central axes S0 and S10. The scattering central axis S0 inclines in the first direction Dx (+Dx direction or −Dx direction) with respect to the third direction Dz. The "azimuth angle" is a direction in planar view obtained by projecting the scattering central axes S0 and S10 on a plane defined by the first direction Dx and the second direction Dy.

Figure 9:
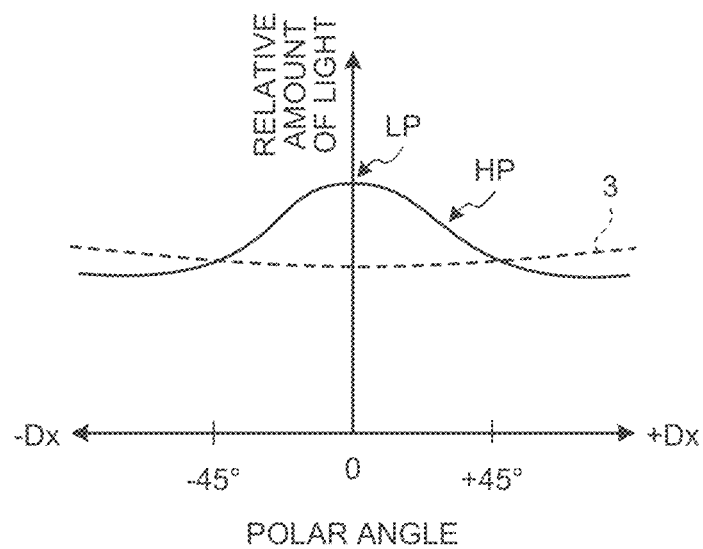
FIG. 9 is a graph schematically illustrating a relation between the relative amount of light scattered by the light diffusion layer and the polar angle.

FIG. 9 is a graph schematically illustrating a relation between the relative amount of light scattered by the light diffusion layer and the polar angle. In FIG. 9, the solid line represents the distribution of the relative amount of light scattered by the light diffusion layer AS. The dotted line represents the light emission distribution property obtained when the light diffusion layer AS is not provided, that is, the light emission distribution property provided only by the light emitting elements 3. FIG. 9 illustrates the polar angle dependence in the azimuth angle direction (first direction Dx) perpendicular to the extension direction of the first light diffusion structure HP.

The abscissa of the graph illustrated in FIG. 9 indicates the polar angle, that is, the inclination angle with respect to the third direction Dz. The ordinate of the graph indicates the relative amount of light emitted from the light diffusion layer AS and the relative amount of light emitted from the light emitting element 3. As illustrated in FIG. 9, the light emitting element 3 represented by the dotted line does not have the peak of the relative amount of light at a polar angle of 0°, that is, in the third direction Dz. The light emitting element 3 has the polar angle dependence that the relative amount of light is greater at polar angles of 45° and −45° than at a polar angle of 0°, for example. FIG. 9 schematically illustrates the light emission distribution property of the light emitting element 3. In an actual configuration, the light emitting elements 3R, 3G, and 3B have different polar angle dependence of the relative amount of light.

As illustrated in FIG. 9, the relative amount of light scattered by the light diffusion layer AS decreases on the high polar angle side (e.g., a polar angle of 45° or greater and −45° or less) and increases on the low polar angle side compared with the relative amount of light provided only by the light emitting elements 3. The light scattered by the light diffusion layer AS has the maximum LP of the relative amount of light near a polar angle of 0° (third direction Dz).

The maximum LP is formed as follows: the light L13 and the light L14 (refer to FIG. 8) incident at a high polar angle are scattered by the light diffusion layer AS, and part of the scattered light S1 and the scattered light S11 is directed in the third direction Dz. As a result, the light diffusion layer AS can increase the relative amount of light in the normal direction of the array substrate 2. Consequently, the display device 1 according to the present embodiment can increase the relative amount of light in the third direction Dz in which an observer highly frequently observes the display device 1.

The first light diffusion structure HP of the light diffusion layer AS according to the present embodiment extends in the second direction Dy. In other words, the first light diffusion structure HP is parallel to the long side of the display region AA. The present embodiment is not limited thereto, and the first light diffusion structure HP may extend in a direction inclining with respect to the second direction Dy or in the first direction Dx, that is, a direction parallel to the short side of the display region AA. In the cross-sectional structure of the first light diffusion structure HP, the thickness of the high refractive index layer HN, the thickness of the low refractive index layer LN, and the layer pitch of the high refractive index layer HN and the low refractive index layer LN may be appropriately modified. The number of high refractive index layers HN and low refractive index layers LN in the first light diffusion structure HP may be appropriately modified.

Figure 10:
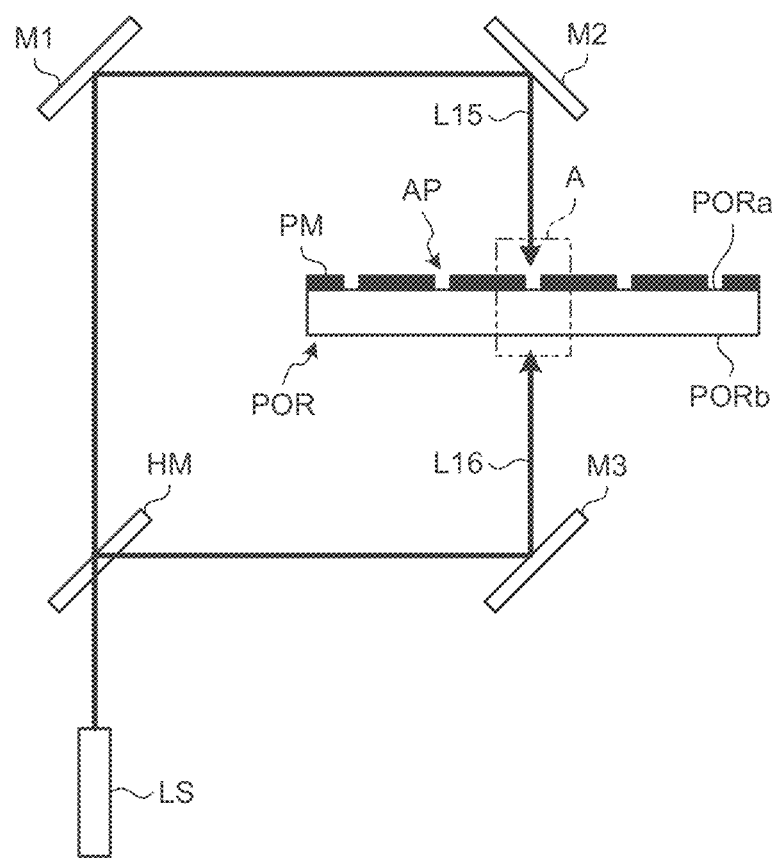
FIG. 10 is a view for explaining a method for manufacturing the light diffusion layer according to the first embodiment.
Figure 11:
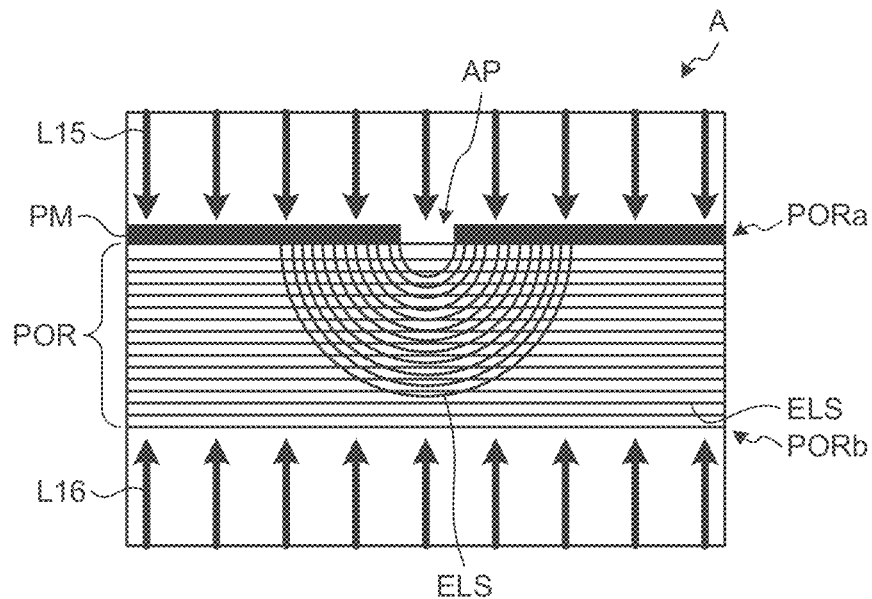
FIG. 11 is an explanatory view illustrating a region A in FIG. 10 in an enlarged manner.
Figure 12:
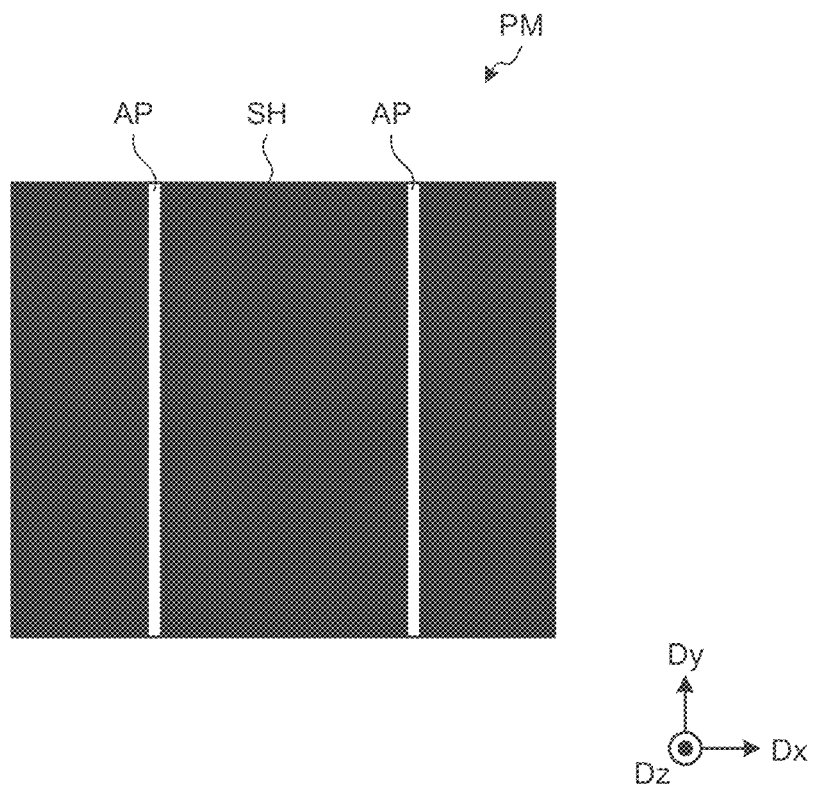
FIG. 12 is a plan view schematically illustrating a photomask used to manufacture the light diffusion layer according to the first embodiment.

The following describes an example of a method for manufacturing the light diffusion layer AS. FIG. 10 is a view for explaining the method for manufacturing the light diffusion layer according to the first embodiment. FIG. 11 is an explanatory view illustrating a region A in FIG. 10 in an enlarged manner. FIG. 12 is a plan view schematically illustrating a photomask used to manufacture the light diffusion layer according to the first embodiment.

As illustrated in FIG. 10, a photoreactive organic film POR is applied and formed on a substrate (not illustrated in FIG. 10). The photoreactive organic film POR is a positive or negative transparent resist, for example.

A photomask PM is disposed facing a front surface PORa of the photoreactive organic film POR. The photomask PM has a light-shielding region SH and openings AP. The light-shielding region SH is made of resin or metal material. The openings AP are formed in the light-shielding region SH. As illustrated in FIG. 12, the openings AP extend in the second direction Dy and are formed adjacent in the first direction Dx. The openings AP are formed corresponding to the first light diffusion structures HP. More specifically, the opening AP is formed at a position overlapping the central axis AX, and the high refractive index layers HN and the low refractive index layers LN are formed parallel to the opening AP. In other words, the extension direction of the first light diffusion structure HP is defined by the extension direction of the opening AP.

Referring back to FIG. 10, a light source LS emits light L15 and light L16 to the front surface PORa and a back surface PORb, respectively, of the photoreactive organic film POR. The light source LS may be a mercury lamp or a laser device, for example. Light emitted from the single light source LS is bifurcated into the light L15 and the light L16 by a half mirror HM. The light L15 having passed through the half mirror HM is reflected by mirrors M1 and M2 and is incident on the front surface PORa. The light L16 reflected by the half mirror HM is reflected by a mirror M3 and is incident on the back surface PORb.

As described above, the light L15 and the light L16 incident on the front surface PORa and the back surface PORb interfere because the light L15 and the light L16 are bifurcated from the single light source LS.

In FIG. 11, equiphase surfaces ELS of light incident on the photoreactive organic film POR are represented by the solid lines. As illustrated in FIG. 11, the equiphase surfaces ELS of the light L16 incident on the back surface PORb are formed perpendicular to the irradiation direction, that is, parallel to the back surface PORb. By contrast, the equiphase surfaces ELS of the light L15 are distributed about the opening AP because the light L15 incident on the front surface PORa spreads about the opening AP.

Constructive interference of the light L15 and the light L16 causes a reaction at the points where the equiphase surfaces ELS coincide. If the photoreactive organic film POR is a photopolymerizable film, a photopolymerization reaction occurs at the points where the equiphase surfaces ELS coincide to increase the molecule density, thereby forming the high refractive index layer HN. The high refractive index layers HN and the low refractive index layers LN are alternately formed into layers at the points where the equiphase surfaces ELS coincide and the points where the equiphase surfaces ELS do not coincide. As a result, the high refractive index layers HN and the low refractive index layers LN are formed so as to have a semicylindrical structure about the central axis AX near the opening AP.

The manufacturing method illustrated in FIGS. 10 to 12 is given by way of example only and may be appropriately modified. The manufacturing device illustrated in FIG. 10 may bifurcate the light into the light L15 and the light L16 using a polarizing beam splitter instead of the half mirror HM. FIGS. 10 and 11 only schematically illustrate the optical paths of the light L15 and the light L16, and the number of mirrors and the optical paths may be appropriately modified.

2. Second Embodiment

Figure 13:
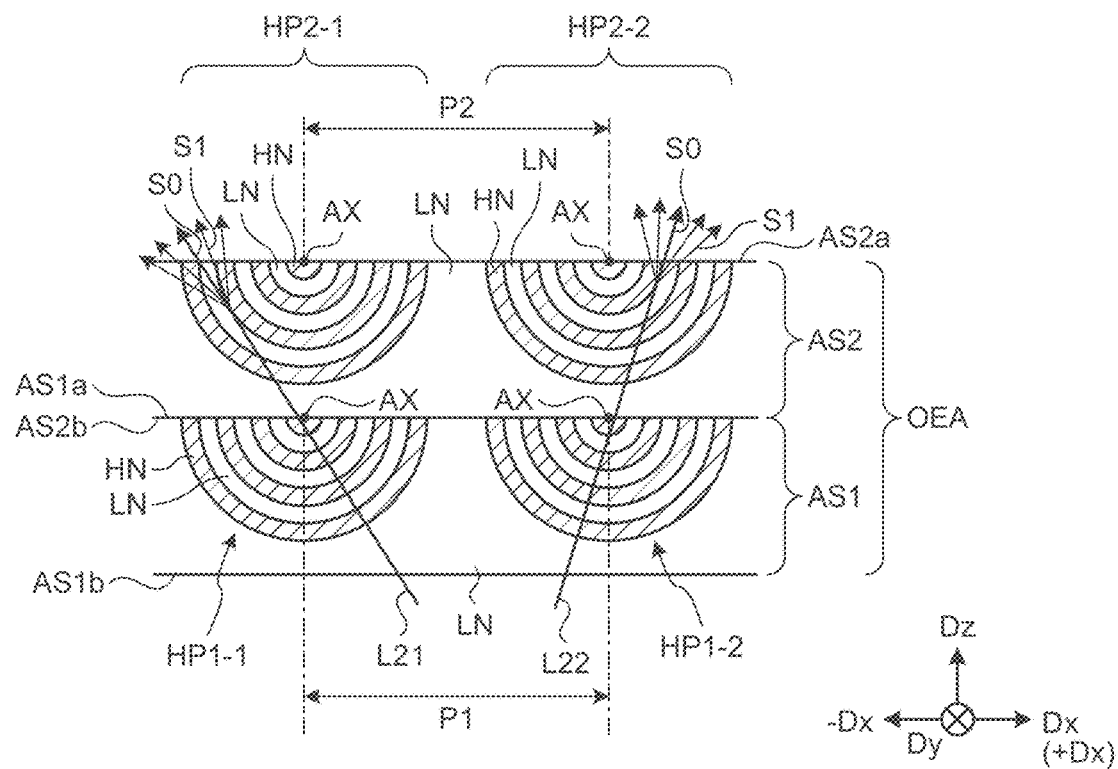
FIG. 13 is a cross-sectional view schematically illustrating the optical member according to a second embodiment.

FIG. 13 is a cross-sectional view schematically illustrating the optical member according to a second embodiment. In the following description, the same components as those described in the embodiment above are denoted by like reference numerals, and overlapping explanation thereof is omitted.

As illustrated in FIG. 13, an optical member OEA according to the second embodiment includes a first light diffusion layer AS1 and a second light diffusion layer AS2. The second light diffusion layer AS2 is layered on the first light diffusion layer AS1. More specifically, the first light diffusion layer AS1 and the second light diffusion layer AS2 are layered in this order on the array substrate 2 in the third direction Dz.

In a manner similar to the light diffusion layer AS described above, the first light diffusion layer AS1 and the second light diffusion layer AS2 each include a plurality of first light diffusion structures HP. Specifically, the first light diffusion layer AS1 includes a plurality of first light diffusion structures HP1-1 and HP1-2. In each of the first light diffusion structures HP1-1 and HP1-2, a plurality of high refractive index layers HN and low refractive index layers LN are layered in a concentric semicylindrical shape. The high refractive index layers HN and the low refractive index layers LN of the first light diffusion structures HP1-1 and HP1-2 are curved and recessed from a first surface AS1a toward a second surface AS1b.

The second light diffusion layer AS2 includes a plurality of first light diffusion structures HP2-1 and HP2-2. In each of the first light diffusion structures HP2-1 and HP2-2, a plurality of high refractive index layers HN and low refractive index layers LN are layered in a concentric semicylindrical shape. The high refractive index layers HN and the low refractive index layers LN of the first light diffusion structures HP2-1 and HP2-2 are curved and recessed from a first surface AS2a toward a second surface AS2b. In other words, the first light diffusion structures HP1-1 and HP1-2 and the first light diffusion structures HP2-1 and HP2-2 are recessed in the same direction.

In the following description, the first light diffusion structures HP1-1, HP1-2, HP2-1, and HP2-2 are simply referred to as the first light diffusion structures HP when they need not be distinguished from one another.

While the cross-sectional structure of the optical member OEA is illustrated in FIG. 13, the first light diffusion layer AS1 and the second light diffusion layer AS2 can have the same planar structure as the structure illustrated in FIG. 7. In other words, both the first light diffusion structures HP of the first light diffusion layer AS1 and the first light diffusion structures HP of the second light diffusion layer AS2 extend in the second direction Dy.

As illustrated in FIG. 13, the first light diffusion structures HP are arranged in the first direction Dx in each of the first light diffusion layer AS1 and the second light diffusion layer AS2. The first light diffusion structures HP2-1 and HP2-2 of the second light diffusion layer AS2 are respectively disposed overlapping the first light diffusion structures HP1-1 and HP1-2 of the first light diffusion layer AS1.

More specifically, the first light diffusion structure HP of the first light diffusion layer AS1 has the same size (radius) as the first light diffusion structure HP of the second light diffusion layer AS2. An arrangement pitch P1 between the first light diffusion structures HP of the first light diffusion layer AS1 is equal to an arrangement pitch P2 between the first light diffusion structures HP of the second light diffusion layer AS2. The position of the central axis AX in the first direction Dx in the first light diffusion layer AS1 overlaps the position of the central axis AX in the first direction Dx in the second light diffusion layer AS2.

The low refractive index layer LN provided between the adjacent first light diffusion structures HP in the second light diffusion layer AS2 overlaps the low refractive index layer LN provided between the adjacent first light diffusion structures HP in the first light diffusion layer AS1. In other words, the optical member OEA has a region made up of only the low refractive index layer LN from the front surface (first surface AS2a) to the back surface (second surface AS1b).

With this configuration, an incident direction of light L21 not scattered by the first light diffusion structure HP1-1 of the first light diffusion layer AS1 is within a range of approximately ±20° with respect to the interface between the high refractive index layer HN and the low refractive index layer LN in the first light diffusion structure HP2-1 of the second light diffusion layer AS2. As a result, the light L21 is scattered by the first light diffusion structure HP2-1 of the second light diffusion layer AS2. Similarly, light L22 not scattered by the first light diffusion structure HP1-2 of the first light diffusion layer AS1 is scattered by the first light diffusion structure HP2-2 of the second light diffusion layer AS2. Part of the scattered light S1 of the light L21 and the light L22 is directed in the third direction Dz with respect to the respective scattering central axes S0.

As a result, the optical member OEA according to the second embodiment increases the components of light scattered in the third direction Dz, as compared with a configuration including only one light diffusion layer AS. Consequently, the optical member OEA can increase the relative amount of light in the third direction Dz.

Alternatively, part of the scattered light S1 scattered by the first light diffusion layer AS1 may be further scattered by the second light diffusion layer AS2. With this mechanism, the optical member OEA can effectively cause part of light incident from the high polar angle side to be directed in third direction Dz.

The configuration of the optical member OEA is given by way of example only and may be appropriately modified. While the second surface AS2b of the second light diffusion layer AS2 is layered in contact with the first surface AS1a of the first light diffusion layer AS1, the present embodiment is not limited thereto. The second light diffusion layer AS2 may be layered in a manner separated from the first light diffusion layer AS1, and another optical functional layer may be provided between the second light diffusion layer AS2 and the first light diffusion layer AS1. The optical member OEA may include three or more light diffusion layers AS.

2-1. First Modification

Figure 14:
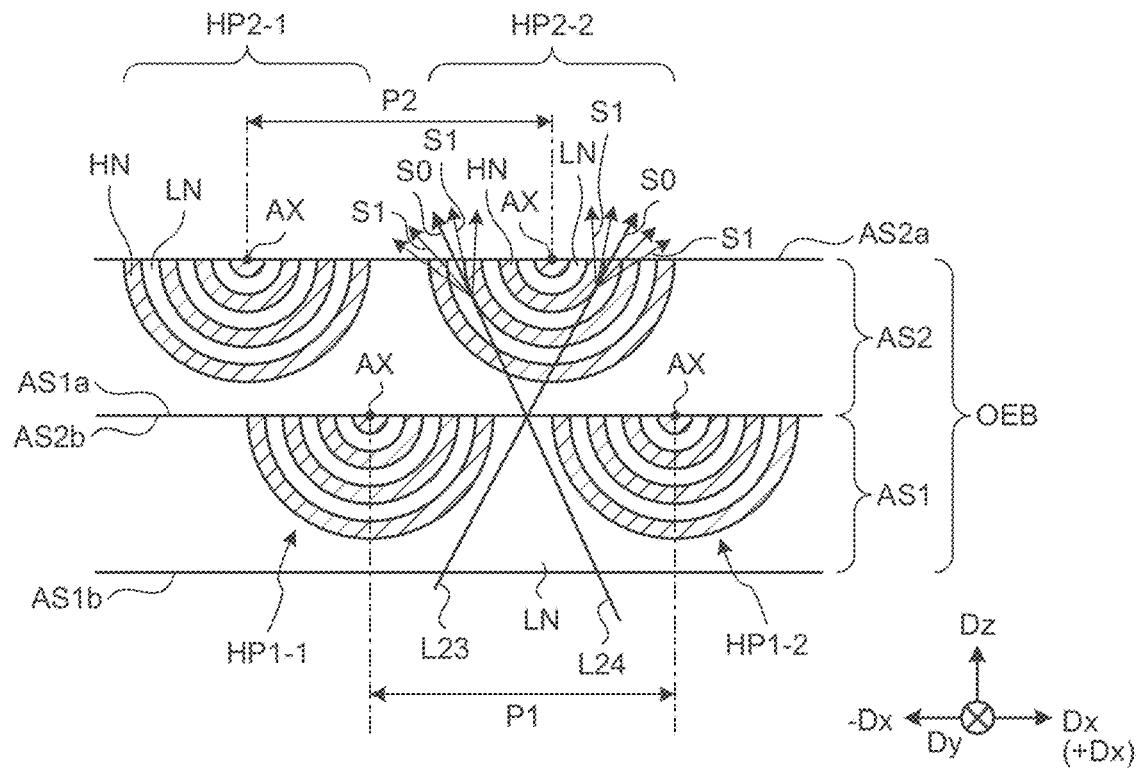
FIG. 14 is a cross-sectional view schematically illustrating an optical member according to a first modification of the second embodiment.

FIG. 14 is a cross-sectional view schematically illustrating an optical member according to a first modification of the second embodiment. As illustrated in FIG. 14, an optical member OEB according to the first modification is different from the optical member OEA according to the second embodiment in that at least part of the first light diffusion structures HP2-1 and HP2-2 of the second light diffusion layer AS2 is disposed at a position not overlapping the first light diffusion structures HP1-1 and HP1-2 of the first light diffusion layer AS1.

In other words, the positions of the central axes AX of the first light diffusion structures HP2-1 and HP2-2 in the first direction Dx are different from those of the central axes AX of the first light diffusion structures HP1-1 and HP1-2 in the first direction Dx. The first light diffusion structure HP2-2 of the second light diffusion layer AS2 is provided on the low refractive index layer LN provided between the first light diffusion structures HP1-1 and HP1-2 of the first light diffusion layer AS1.

The first light diffusion structure HP of the first light diffusion layer AS1 has the same configuration as the first light diffusion structure HP of the second light diffusion layer AS2. In other words, the first light diffusion structures HP1-1, HP1-2, HP2-1, and HP2-2 are the same in thickness, the number of layers, and size (radius). The arrangement pitch P1 between the first light diffusion structures HP of the first light diffusion layer AS1 is equal to the arrangement pitch P2 between the first light diffusion structures HP of the second light diffusion layer AS2.

If light L23 and light L24 pass through the low refractive index layer LN between the first light diffusion structures HP1-1 and HP1-2 of the first light diffusion layer AS1 and are not scattered by the first light diffusion layer AS1, they are scattered by the first light diffusion structure HP2-2 of the second light diffusion layer AS2. Consequently, the optical member OEB according to the first modification can increase the relative amount of light in the third direction Dz.

3. Third Embodiment

Figure 15:
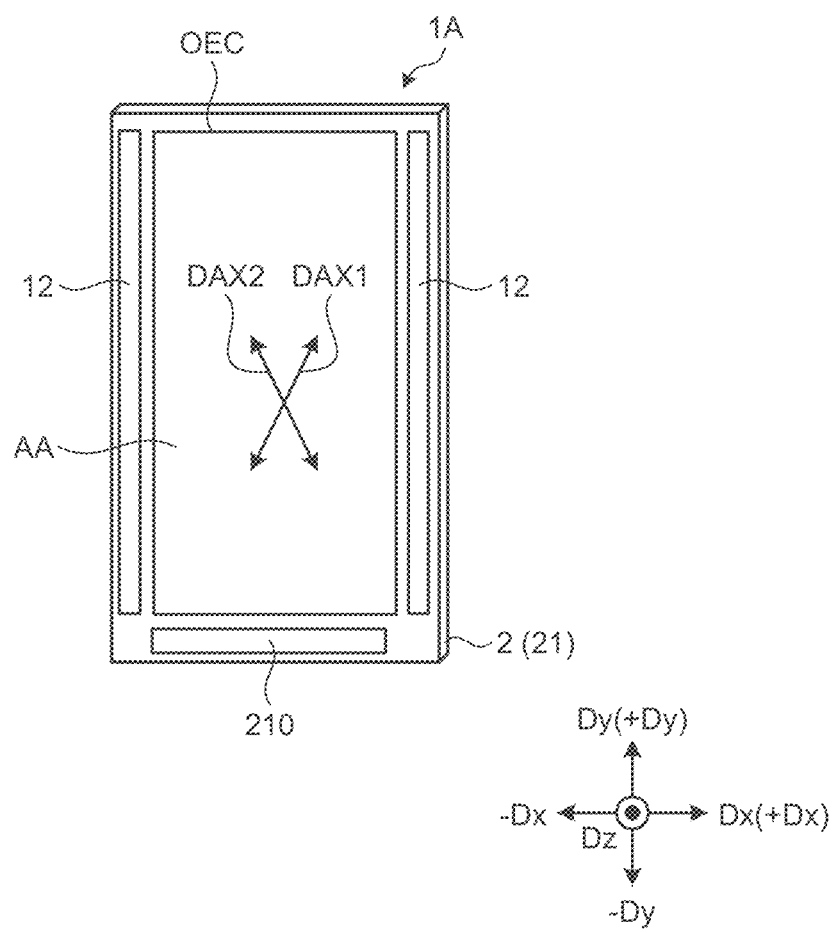
FIG. 15 is a view for explaining an extension direction of a first light diffusion structure of a first light diffusion layer and an extension direction of the first light diffusion structure of a second light diffusion layer in an optical member according to a third embodiment.

FIG. 15 is a view for explaining the extension direction of the first light diffusion structure of the first light diffusion layer and the extension direction of the first light diffusion structure of the second light diffusion layer in an optical member according to a third embodiment. The third embodiment describes a configuration in which the first light diffusion structure HP of the second light diffusion layer AS2 extends in a direction different from the extension direction of the first light diffusion structure HP of the first light diffusion layer AS1.

A first extension direction DAX1 illustrated in FIG. 15 indicates the extension direction of the central axis AX of the first light diffusion structure HP of the first light diffusion layer AS1. A second extension direction DAX2 indicates the extension direction of the central axis AX of the first light diffusion structure HP of the second light diffusion layer AS2.

The first extension direction DAX1 and the second extension direction DAX2 incline with respect to the second direction Dy. The first extension direction DAX1 inclines with respect to the second direction Dy in a direction opposite to the second extension direction DAX2. In other words, the first extension direction DAX1 and the second extension direction DAX2 intersect in planar view.

The first extension direction DAX1 and the second extension direction DAX2 are symmetrical about a direction parallel to the second direction Dy. The absolute value of the angle formed by the first extension direction DAX1 and the second direction Dy is equal to that of the angle formed by the second extension direction DAX2 and the second direction Dy.

This configuration makes the display property (e.g., polar angle dependence of the relative amount of light) of a display device 1A symmetrical, thereby providing satisfactory display property.

Figure 16:
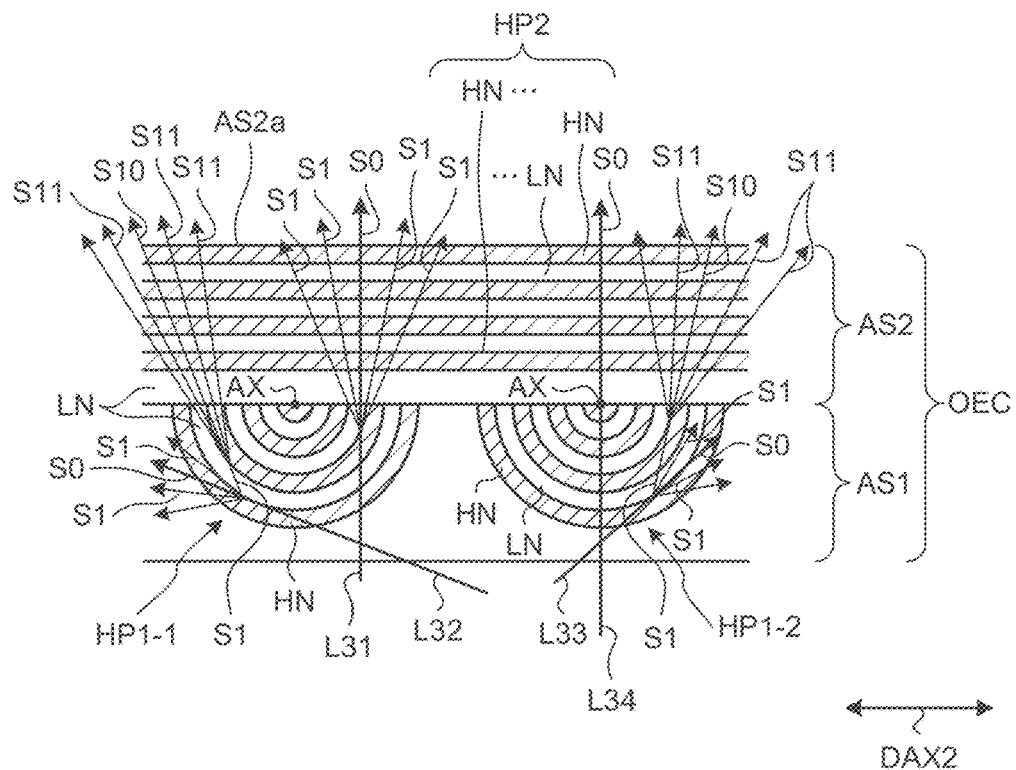
FIG. 16 is a cross-sectional view of the optical member according to the third embodiment cut along a second extension direction.

FIG. 16 is a cross-sectional view of the optical member according to the third embodiment cut along the second extension direction. FIG. 16 is a cross-sectional view along the central axis AX of the first light diffusion structure HP of the second light diffusion layer AS2, for example.

As illustrated in FIG. 16, the first light diffusion structure HP of the first light diffusion layer AS1 has a concentric semicylindrical structure in which the high refractive index layers HN and the low refractive index layers LN are layered in a similar manner to the embodiments above. On the cross section along the second extension direction DAX2, the high refractive index layers HN and the low refractive index layers LN in the first light diffusion structure HP of the second light diffusion layer AS2 extend in a direction parallel to the first surface AS2a and along the second extension direction DAX2 and are alternately layered in the third direction Dz.

The first light diffusion layer AS1 scatters light L31, light L32, and light L33. The scattered light S1 and the scattered light S11 scattered by the first light diffusion layer AS1 pass through the second light diffusion layer AS2 without being scattered thereby. Light L34 traveling in the third direction Dz and passing through the central axis AX passes through the first light diffusion layer AS1 and the second light diffusion layer AS2 without being scattered thereby.

Figure 17:
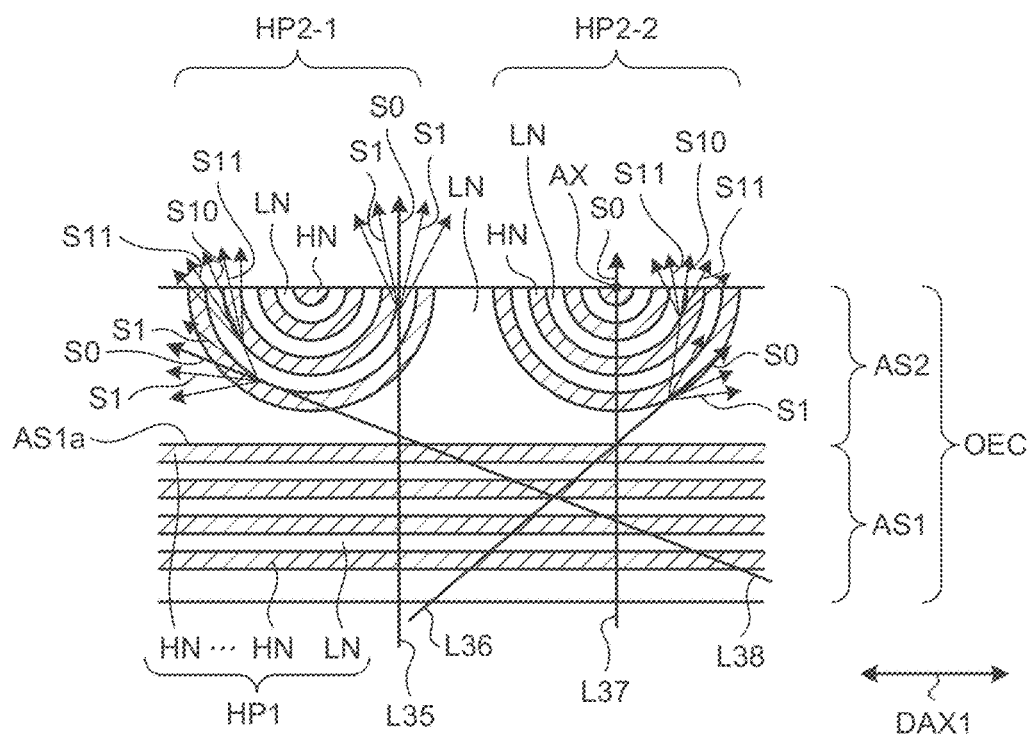
FIG. 17 is a cross-sectional view of the optical member according to the third embodiment cut along a first extension direction.

FIG. 17 is a cross-sectional view of the optical member according to the third embodiment cut along the first extension direction. FIG. 17 is a cross-sectional view along the central axis AX of the first light diffusion structure HP of the first light diffusion layer AS1, for example.

On the cross section along the first extension direction DAX1 illustrated in FIG. 17, the high refractive index layers HN and the low refractive index layers LN in the first light diffusion structure HP of the first light diffusion layer AS1 extend in a direction parallel to the first surface AS1a and along the first extension direction DAX1 and are alternately layered in the third direction Dz. In a manner similar to the embodiments above, the first light diffusion structure HP of the second light diffusion layer AS2 has a concentric semicylindrical structure in which the high refractive index layers HN and the low refractive index layers LN are layered.

As illustrated in FIG. 17, light L35, light L36, light L37, and light L38 pass through the first light diffusion layer AS1 without being scattered thereby. The second light diffusion layer AS2 scatters the light L35, the light L36, and the light L38 having passed through the first light diffusion layer AS1. Out of the light beams having passed through the first light diffusion layer AS1, the light L37 traveling in the third direction Dz and passing through the central axis AX passes through the first light diffusion layer AS1 and the second light diffusion layer AS2 without being scattered thereby.

As described above, the first extension direction DAX1 of the first light diffusion layer AS1 is different from the second extension direction DAX2 of the second light diffusion layer AS2. With this configuration, the first light diffusion layer AS1 and the second light diffusion layer AS2 can scatter the components of light traveling at different azimuth angles. Specifically, the first light diffusion layer AS1 mainly scatters light traveling at an azimuth angle orthogonal to the first extension direction DAX1. The second light diffusion layer AS2 mainly scatters light traveling at an azimuth angle orthogonal to the second extension direction DAX2. Consequently, the display device 1A can increase the relative amount of light in the third direction Dz.

Figure 18:
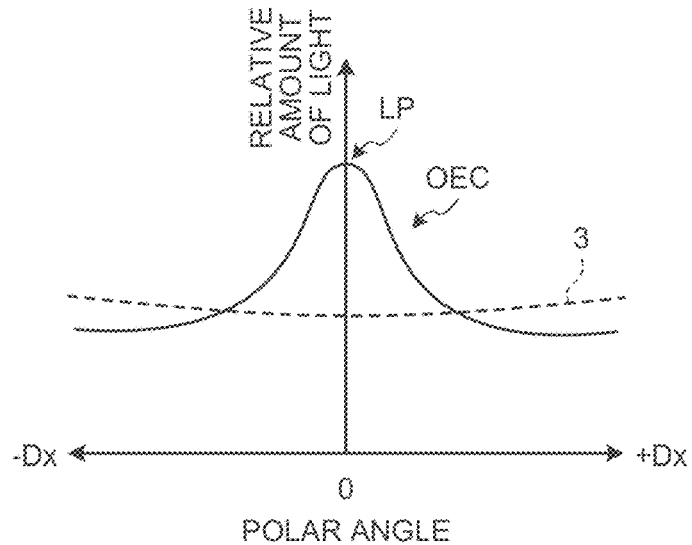
FIG. 18 is a graph schematically illustrating a relation between the relative amount of light scattered by the optical member according to the third embodiment and the polar angle.

FIG. 18 is a graph schematically illustrating a relation between the relative amount of light scattered by the optical member according to the third embodiment and the polar angle. In FIG. 18, the solid line represents the distribution of the relative amount of light scattered by an optical member OEC. The dotted line represents the light emission distribution property provided only by the light emitting elements 3. The azimuth angle direction in FIG. 18 is the short side direction (first direction Dx) of the display region AA. In other words, the abscissa of the graph illustrated in FIG. 18 indicates the polar angle dependence in a direction inclining in the first direction Dx with respect to the third direction Dz.

As illustrated in FIG. 18, the relative amount of light scattered by the optical member OEC has the maximum LP of the relative amount of light near a polar angle of 0° (third direction Dz). The distribution of the relative amount of light is symmetrical between the azimuth angles in the +Dx direction and the azimuth angles in the −Dx direction.

In the present embodiment, the relative amount of light at the maximum LP with respect to the amount of light of the light emitting elements 3 alone is greater than the relative amount of light of the light diffusion layer AS according to the first embodiment illustrated in FIG. 9. The half width of the relative amount of light is less than that in FIG. 9.

In other words, the first light diffusion structures HP of the light diffusion layers AS according to the first and the second embodiments scatter light traveling in a single azimuth angle direction (first direction Dx). By contrast, the first light diffusion structures HP of the first light diffusion layers AS1 and the first light diffusion structures HP of the second light diffusion layers AS2 according to the third embodiment can scatter light traveling in different azimuth angle directions. As a result, the third embodiment has a greater amount of components of light traveling at azimuth angles capable of being scattered. Consequently, the third embodiment can increase the amount of light at a polar angle of 0°.

3-1. Second Modification

Figure 19:
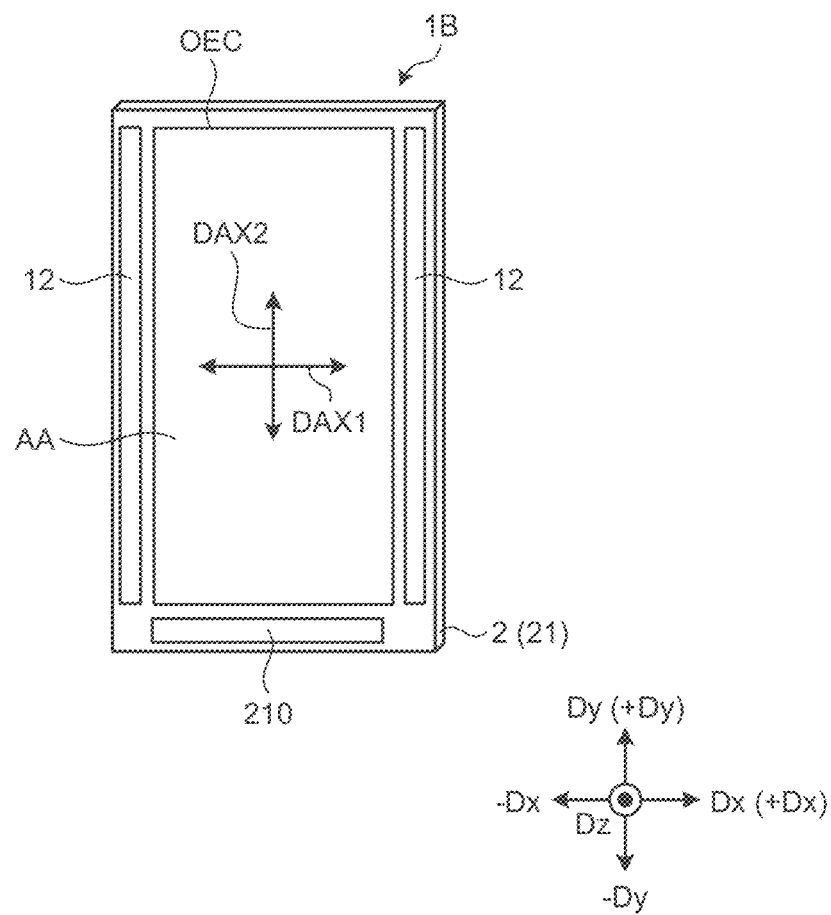
FIG. 19 is an explanatory diagram for explaining the extension direction of the first light diffusion structure of the first light diffusion layer and the extension direction of the first light diffusion structure of the second light diffusion layer in an optical member according to a second modification of the third embodiment.

FIG. 19 is an explanatory diagram for explaining the extension direction of the first light diffusion structure of the first light diffusion layer and the extension direction of the first light diffusion structure of the second light diffusion layer in an optical member according to a second modification of the third embodiment. The second modification is different from the third embodiment in that the first extension direction DAX1 of the first light diffusion layer AS1 is orthogonal to the extension direction DAX2 of the second light diffusion layer AS2.

Specifically, the first extension direction DAX1 is directed in the first direction Dx, that is, a direction parallel to the short side (first side) of the display region AA. The second extension direction DAX2 is directed in the second direction Dy, that is, a direction parallel to the long side (second side) of the display region AA.

The first light diffusion layer AS1 mainly scatters light the azimuth angle of which is orthogonal to the first extension direction DAX1 (first direction Dx). The second light diffusion layer AS2 mainly scatters light the azimuth angle of which is orthogonal to the second extension direction DAX2 (second direction Dy). Consequently, a display device 1B can provide brighter display because the first extension direction DAX1 and the second extension direction DAX2 are directed in the first direction Dx and the second direction Dy, respectively, in which the observer highly frequently observes the display device 1B.

4. Fourth Embodiment

Figure 20:
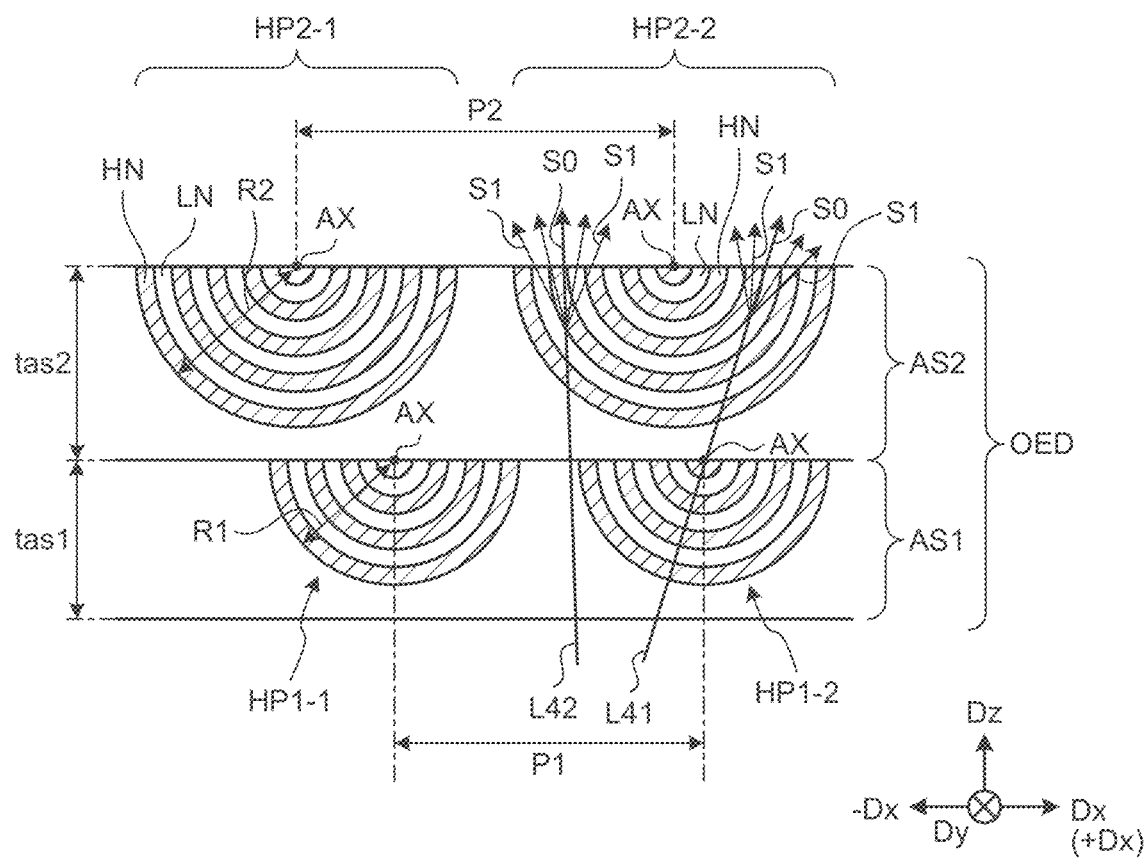
FIG. 20 is a cross-sectional view schematically illustrating an optical member according to a fourth embodiment.

FIG. 20 is a cross-sectional view schematically illustrating an optical member according to a fourth embodiment. As illustrated in FIG. 20, an optical member OED according to the fourth embodiment is different from the embodiments above in that the size of the first light diffusion structure HP of the first light diffusion layer AS1 is different from that of the first light diffusion structure HP of the second light diffusion layer AS2.

A radius R2 of the first light diffusion structures HP2-1 and HP2-2 on the cross section of the second light diffusion layer AS2 is different from a radius R1 of the first light diffusion structures HP1-1 and HP1-2 on the cross section of the first light diffusion layer AS1. Specifically, the radius R2 of the first light diffusion structures HP2-1 and HP2-2 is greater than the radius R1 of the first light diffusion structures HP1-1 and HP1-2. A thickness tas2 of the second light diffusion layer AS2 is greater than a thickness tas1 of the first light diffusion layer AS1.

The arrangement pitch P2 between the first light diffusion structures HP2-1 and HP2-2 of the second light diffusion layer AS2 is different from the arrangement pitch P1 between the first light diffusion structures HP1-1 and HP1-2 of the first light diffusion layer AS1. The arrangement pitch P2 according to the present embodiment is greater than the arrangement pitch P1.

With this configuration, at least part of the first light diffusion structures HP2-1 and HP2-2 of the second light diffusion layer AS2 is provided at a position not overlapping the first light diffusion structures HP1-1 and HP1-2 of the first light diffusion layer AS1. As a result, light is more likely to be scattered by any one of the first light diffusion structures HP of the first light diffusion layer AS1 and the second light diffusion layer AS2 than in a case where the first light diffusion structures HP1-1, HP1-2, HP2-1, and HP2-2 of the first light diffusion layer AS1 and the second light diffusion layer AS2 have the same size and the same arrangement pitch.

Light L41 and light L42 having passed through the first light diffusion layer AS1 without being scattered thereby, for example, are scattered by the first light diffusion structure HP2-2 of the second light diffusion layer AS2, thereby increasing the components of the scattered light S1 traveling in the third direction Dz. Consequently, the present embodiment can increase the relative amount of light in the third direction Dz.

The size relation between the radii of the first light diffusion structures HP may be reversed. In other words, the radius R2 of the first light diffusion structures HP2-1 and HP2-2 may be less than the radius R1 of the first light diffusion structures HP1-1 and HP1-2. The size relation between the arrangement pitch P1 and the arrangement pitch P2 may be reversed. In other words, the arrangement pitch P1 may be greater than the arrangement pitch P2.

The high refractive index layers HN and the low refractive index layers LN included in the first light diffusion structures HP of the second light diffusion layer AS2 are equal in thickness to those included in the first light diffusion structures HP of the first light diffusion layer AS1, but different therefrom in number. The present embodiment is not limited thereto, and the high refractive index layers HN and the low refractive index layers LN included in the first light diffusion layer AS1 may be different in thickness from those included in the second light diffusion layer AS2. The arrangement pitches P1 and P2 may be the same between the first light diffusion layer AS1 and the second light diffusion layer AS2, and the radii R1 and R2 may be different therebetween. Alternatively, the radii R1 and R2 may be the same between the first light diffusion layer AS1 and the second light diffusion layer AS2, and the arrangement pitches P1 and P2 may be different therebetween. The configuration according to the present embodiment can be applied to the third embodiment.

5. Fifth Embodiment

Figure 21:
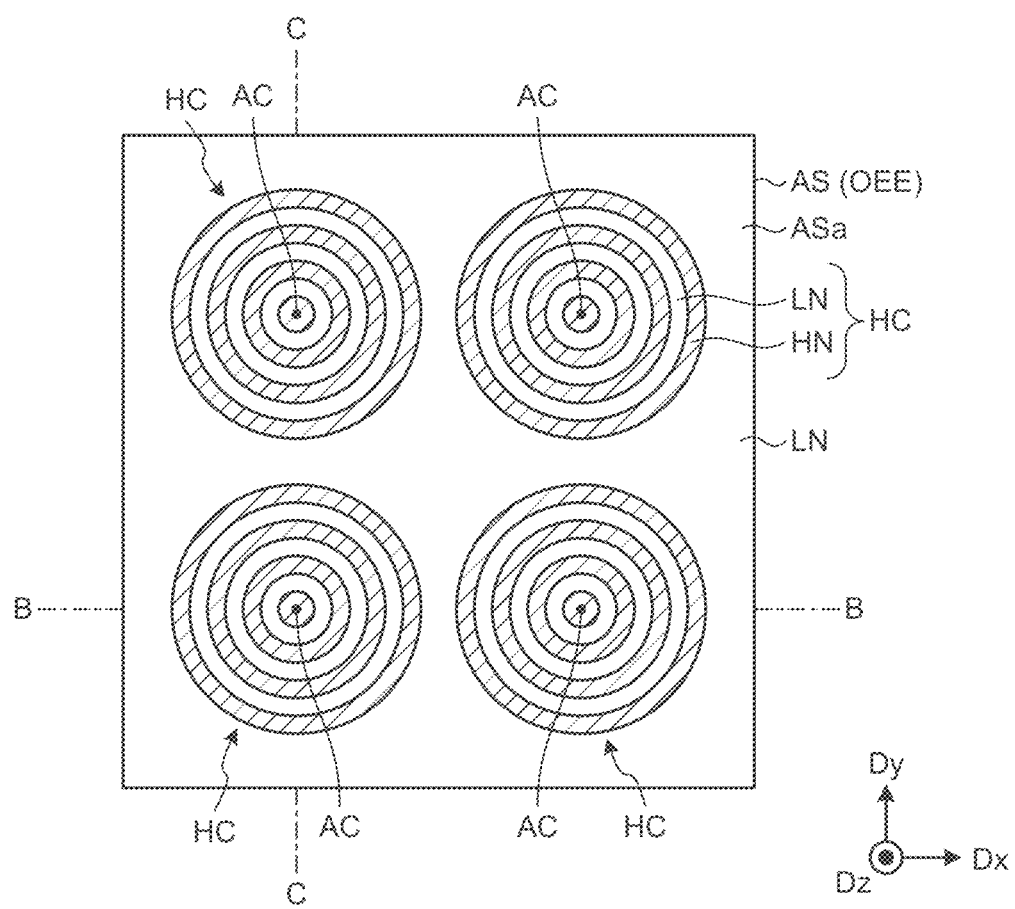
FIG. 21 is a plan view schematically illustrating an optical member according to a fifth embodiment.

FIG. 21 is a plan view schematically illustrating an optical member according to a fifth embodiment. While the first to the fourth embodiments have described the examples in which the first light diffusion structure HP has a concentric semicylindrical structure, the present disclosure is not limited thereto.

As illustrated in FIG. 21, an optical member OEE (light diffusion layer AS) according to the fifth embodiment includes a plurality of second light diffusion structures HC. The second light diffusion structures HC are arrayed in a matrix (row-column configuration) in planar view. While 2 rows and 2 columns, that is, four second light diffusion structures HC are illustrated in FIG. 21, a large number of second light diffusion structures HC are arranged in the first direction Dx and the second direction Dy in an actual configuration. Two or more second light diffusion structures HC are provided overlapping one light emitting element 3. In other words, the number of second light diffusion structures HC is equal to or greater than the number of light emitting elements 3.

In each of the second light diffusion structures HC, the high refractive index layers HN and the low refractive index layers LN are layered in a concentric hemispherical shape. A center AC of the second light diffusion structure HC according to the present embodiment is positioned on the first surface ASa of the light diffusion layer AS, and the high refractive index layers HN and the low refractive index layers LN are concentrically and alternately disposed in planar view. The outermost periphery of the second light diffusion structure HC is formed of the high refractive index layer HN. The space between the second light diffusion structures HC disposed adjacent to each other in the first direction Dx and the second direction Dy is provided with the low refractive index layer LN.

The cross-sectional structure of the optical member OEE (light diffusion layer AS) according to the fifth embodiment is the same as the structure illustrated FIG. 8. Line B-B illustrated in FIG. 21, for example, passes through the centers AC of the second light diffusion structures HC arrayed in the first direction Dx. Line C-C passes through the centers AC of the second light diffusion structures HC arrayed in the second direction Dy. The cross-sectional structure along line B-B and the cross-sectional structure along line C-C are the same as the structure illustrated in FIG. 8.

Focusing on each of the second light diffusion structures HC, the cross-sectional view along the center AC has the same concentric multilayered structure as that illustrated in FIG. 8 when viewed at any azimuth angle because the second light diffusion structure HC has a concentric hemispherical shape. In other words, the second light diffusion structures HC each scatter light traveling in an incident direction within a range of approximately ±20° with respect to the interface between the high refractive index layer HN and the low refractive index layer LN out of incident light from all azimuth angle directions. If the optical member OEE is composed of one light diffusion layer AS, the optical member OEE can scatter incident light beams traveling in all directions and cause them to be directed in the third direction Dz. Consequently, the optical member of the fifth embodiment can provide more isotropic display property independent of the azimuth angle.

Figure 22:
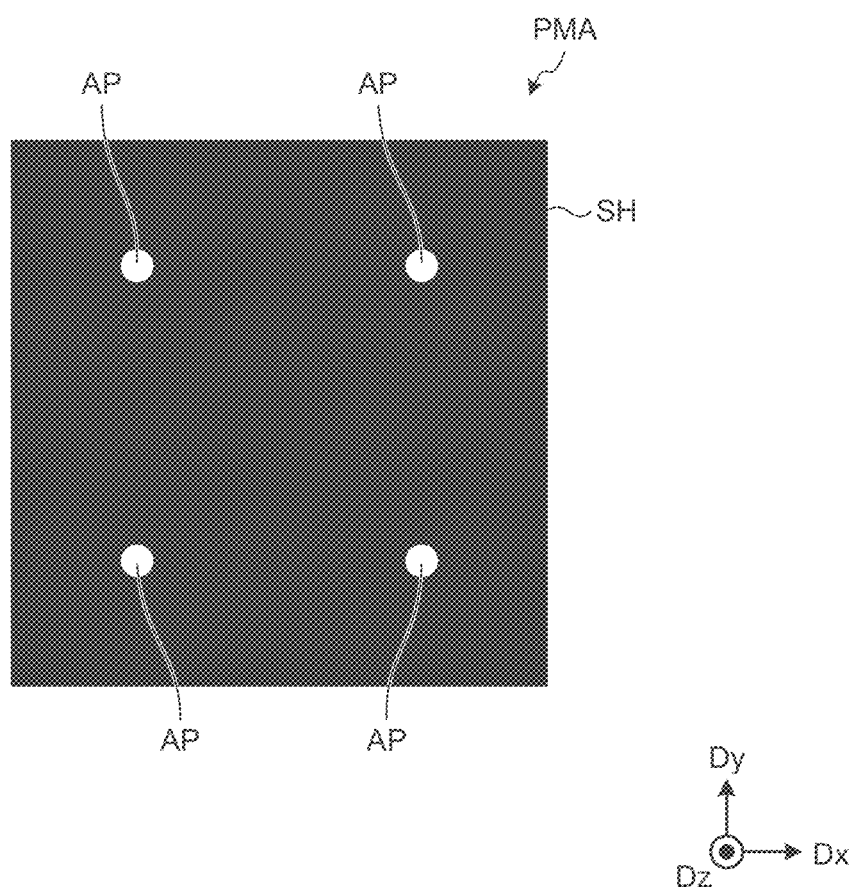
FIG. 22 is a plan view schematically illustrating a photomask used to manufacture the light diffusion layer according to the fifth embodiment.

FIG. 22 is a plan view schematically illustrating a photomask used to manufacture the light diffusion layer according to the fifth embodiment. As illustrated in FIG. 22, the openings AP according to the fifth embodiment each have a circular shape and are formed in the light-shielding region SH of a photomask PMA. The openings AP are disposed in a matrix (row-column configuration) corresponding to the centers AC of the respective second light diffusion structures HC.

In manufacturing the light diffusion layer AS, the equiphase surfaces ELS are formed in a concentric hemispherical shape about the spot-like opening AP, thereby forming the multilayered structure of the second light diffusion structure HC. The light diffusion layer AS (optical member OEE) according to the fifth embodiment may be manufactured by the same manufacturing method as the method illustrated in FIGS. 10 and 11.

5-1. Third Modification

Figure 23:
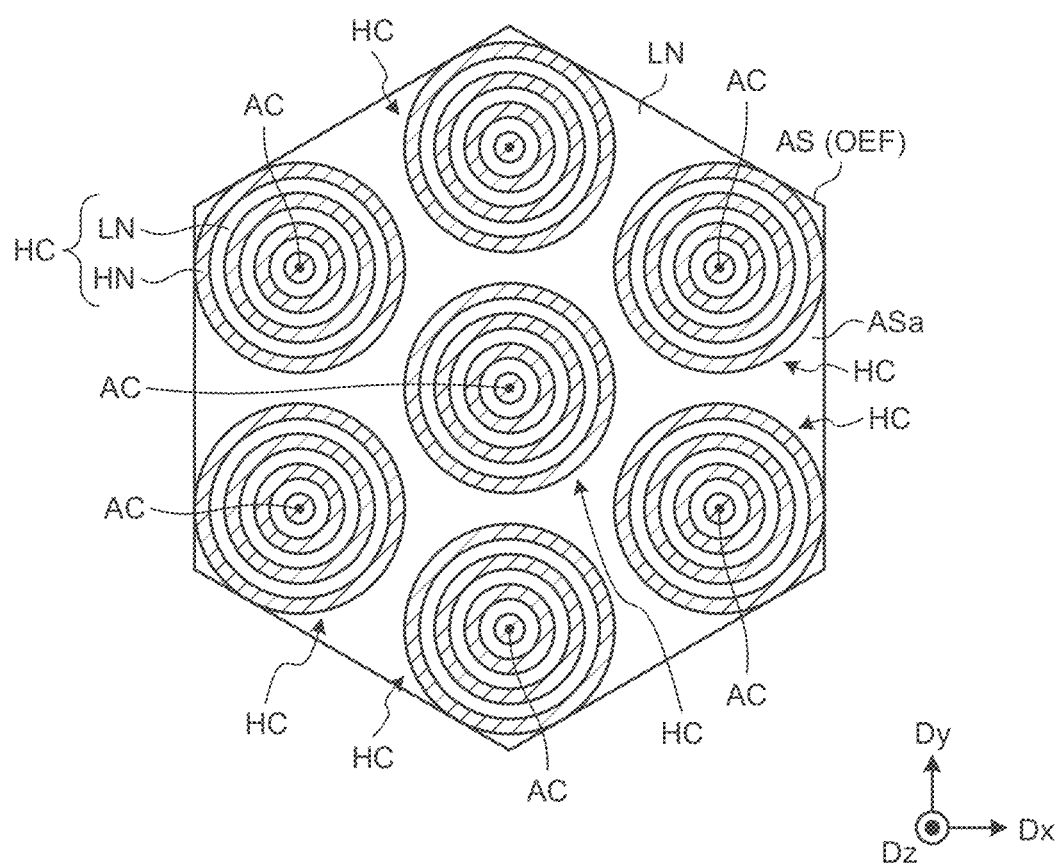
FIG. 23 is a plan view schematically illustrating an optical member according to a third modification of the fifth embodiment.

FIG. 23 is a plan view schematically illustrating an optical member according to a third modification of the fifth embodiment. The arrangement of the second light diffusion structures HC in planar view is not limited to a matrix (row-column configuration). As illustrated in FIG. 23, the second light diffusion structures HC in an optical member OEF (light diffusion layer AS) according to the third modification are disposed in a triangular grid.

With this configuration, the optical member OEF according to the third modification can include the second light diffusion structures HC with higher density than the fifth embodiment illustrated in FIG. 21. In other words, the area of the low refractive index layer LN disposed between the second light diffusion layers HC can be made smaller. Consequently, the third modification can increase the relative amount of light in the third direction Dz by reducing light passing through the light diffusion layer AS without being scattered thereby.

While the optical member OEF (light diffusion layer AS) illustrated in FIG. 23 has a hexagonal shape to facilitate the reader's understanding, the optical member OEF (light diffusion layer AS) in an actual configuration has a square shape corresponding to the display region AA. Similarly, a photomask PMB illustrated in FIG. 24 also has a square shape.

Figure 24:
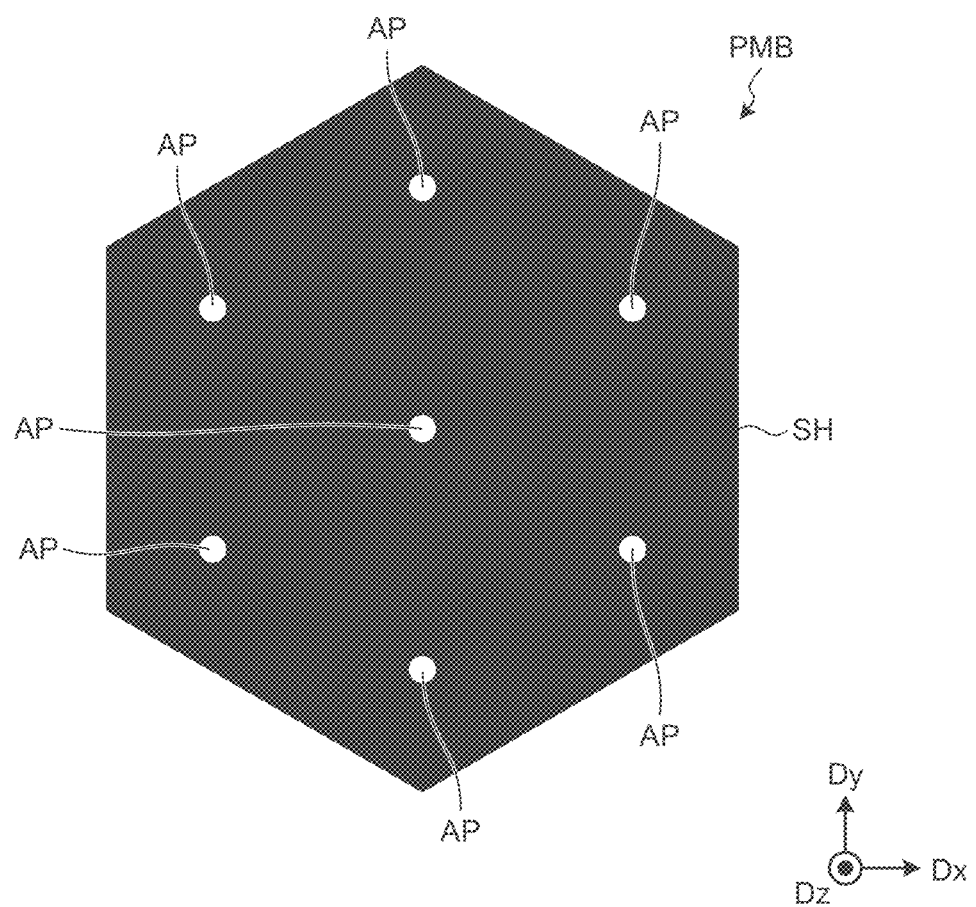
FIG. 24 is a plan view schematically illustrating a photomask used to manufacture the light diffusion layer according to the third modification of the fifth embodiment.

FIG. 24 is a plan view schematically illustrating the photomask used to manufacture the light diffusion layer according to the third modification of the fifth embodiment. As illustrated in FIG. 24, the openings AP in the photomask PMB according to the third modification are disposed in a triangular grid corresponding to the centers AC of the respective second light diffusion structures HC. As described above, the configuration of the second light diffusion structures HC can be changed by the shape and the positions of the openings AP of the photomask PMB.

6. Sixth Embodiment

Figure 25:
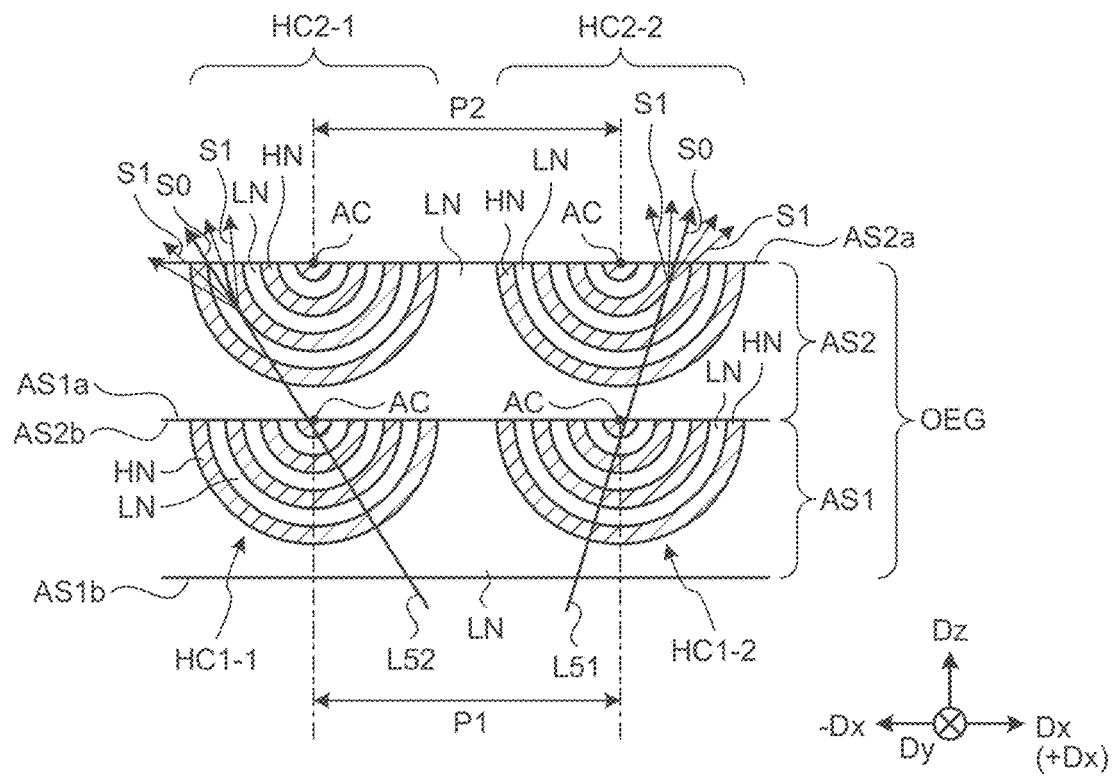
FIG. 25 is a cross-sectional view schematically illustrating an optical member according to a sixth embodiment.

FIG. 25 is a cross-sectional view schematically illustrating an optical member according to a sixth embodiment. As illustrated in FIG. 25, an optical member OEG according to the sixth embodiment includes the first light diffusion layer AS1 and the second light diffusion layer AS2. The second light diffusion layer AS2 is layered on the first light diffusion layer AS1.

In a manner similar to the light diffusion layer AS according to the fifth embodiment, the first light diffusion layer AS1 and the second light diffusion layer AS2 each include a plurality of second light diffusion structures HC. Specifically, the first light diffusion layer AS1 includes a plurality of second light diffusion structures HC1-1 and HC1-2. In each of the second light diffusion structures HC1-1 and HC1-2, a plurality of high refractive index layers HN and low refractive index layers LN are layered in a concentric hemispherical shape. The second light diffusion structures HC1-1 and HC1-2 each have the center AC positioned on the first surface AS1a and are curved and recessed toward the second surface AS1b.

The second light diffusion layer AS2 includes a plurality of second light diffusion structures HC2-1 and HC2-2. In each of the second light diffusion structures HC2-1 and HC2-2, a plurality of high refractive index layers HN and low refractive index layers LN are layered in a concentric hemispherical shape. The second light diffusion structures HC2-1 and HC2-2 each have the center AC positioned on the first surface AS2a and are curved and recessed toward the second surface AS2b. In the following description, the second light diffusion structures HC1-1, HC1-2, HC2-1, and HC2-2 are simply referred to as the second light diffusion structures HC when they need not be distinguished from one another.

While the cross-sectional structure of the optical member OEG is illustrated in FIG. 25, the first light diffusion layer AS1 and the second light diffusion layer AS2 can have the same planar structure as the structure illustrated in FIG. 21 or 23. In other words, the second light diffusion structures HC of the first light diffusion layer AS1 and the second light diffusion structures HC of the second light diffusion layer AS2 are arrayed in a matrix (row-column configuration) or a triangular grid in planar view.

As illustrated in FIG. 25, the second light diffusion structures HC are arranged in the first direction Dx in each of the first light diffusion layer AS1 and the second light diffusion layer AS2. The second light diffusion structures HC2-1 and HC2-2 of the second light diffusion layer AS2 are disposed overlapping the second light diffusion structures HC1-1 and HC1-2, respectively, of the first light diffusion layer AS1. More specifically, the second light diffusion structure HC of the first light diffusion layer AS1 has the same size (radius) as the second light diffusion structure HC of the second light diffusion layer AS2. The arrangement pitch P1 between the second light diffusion structures HC of the first light diffusion layer AS1 is equal to the arrangement pitch P2 between the second light diffusion structures HC of the second light diffusion layer AS2. The position of the center AC of the second light diffusion structure HC in the first light diffusion layer AS1 in planar view overlaps the position of the center AC of the second light diffusion structure HC in the second light diffusion layer AS2 in planar view.

With this configuration, if light L52 is not scattered by the second light diffusion structure HC1-1 of the first light diffusion layer AS1, it is scattered by the second light diffusion structure HC2-1 of the second light diffusion layer AS2. The light L52 travels in an incident direction within a range of approximately ±20° with respect to the interface between the high refractive index layer HN and the low refractive index layer LN in the second light diffusion structure HC2-1 of the second light diffusion layer AS2. Similarly, if light L51 is not scattered by the second light diffusion structure HC1-2 of the first light diffusion layer AS1, it is scattered by the second light diffusion structure HC2-2 of the second light diffusion layer AS2. Part of the scattered light S1 of the light L51 and the light L52 is directed in the third direction Dz with respect to the respective scattering central axes S0.

While the second light diffusion structure HC in FIG. 25 scatters the light L51 and the light L52 the azimuth angle of which is in the first direction Dx, for example, the present embodiment is not limited thereto. As described above, the second light diffusion structure HC can scatter incident light from all the azimuth angle directions other than the first direction Dx.

6-1. Fourth Modification

Figure 26:
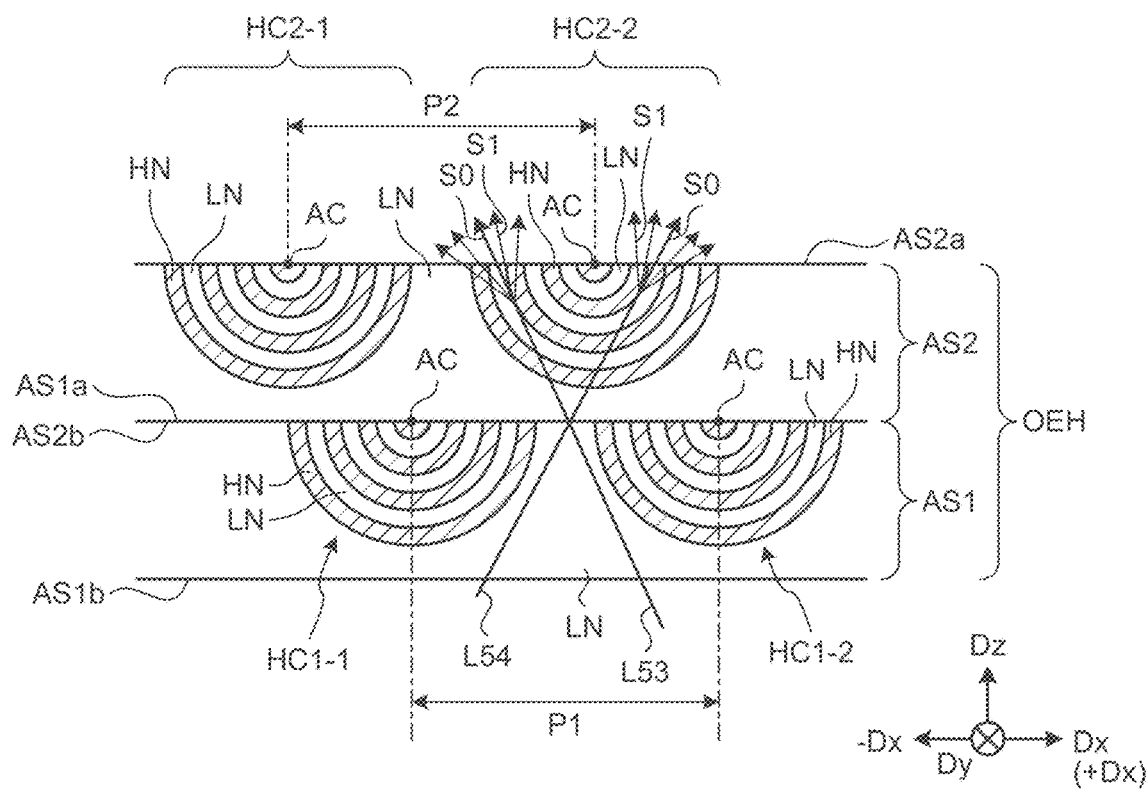
FIG. 26 is a cross-sectional view schematically illustrating an optical member according to a fourth modification of the sixth embodiment.

FIG. 26 is a cross-sectional view schematically illustrating an optical member according to a fourth modification of the sixth embodiment. An optical member OEH according to the fourth modification is different from the optical member OEG according to the sixth embodiment in that at least part of the second light diffusion structures HC2-1 and HC2-2 of the second light diffusion layer AS2 is disposed at a position not overlapping the second light diffusion structures HC1-1 and HC1-2 of the first light diffusion layer AS1.

As illustrated in FIG. 26, the positions of the central axes AC of the second light diffusion structures HC2-1 and HC2-2 in the first direction Dx are different from those of the central axes AC of the second light diffusion structures HC1-1 and HC1-2 in the first direction Dx. The second light diffusion structure HC2-2 of the second light diffusion layer AS2 is provided on the low refractive index layer LN provided between the second light diffusion structures HC1-1 and HC1-2 of the first light diffusion layer AS1.

The second light diffusion structure HC of the first light diffusion layer AS1 has the same configuration as the second light diffusion structure HC of the second light diffusion layer AS2. In other words, the second light diffusion structures HC1-1, HC1-2, HC2-1, and HC2-2 are the same in thickness, the number of layers, and size (radius). The arrangement pitch P1 between the second light diffusion structures HC of the first light diffusion layer AS1 is equal to the arrangement pitch P2 between the second light diffusion structures HC of the second light diffusion layer AS2. The second light diffusion structure HC of the first light diffusion layer AS1 and the second light diffusion structure HC of the second light diffusion layer AS2 may have different sizes (radii). The arrangement pitch P1 may be different from the arrangement pitch P2.

If light L53 and light L54 pass through the low refractive index layer LN between the second light diffusion structures HC1-1 and HC1-2 of the first light diffusion layer AS1 without being scattered thereby, they are scattered by the second light diffusion structure HC2-2 of the second light diffusion layer AS2. Consequently, the optical member OEH according to the fourth modification can increase the relative amount of light in the third direction Dz.

6-2. Fifth Modification

Figure 27:
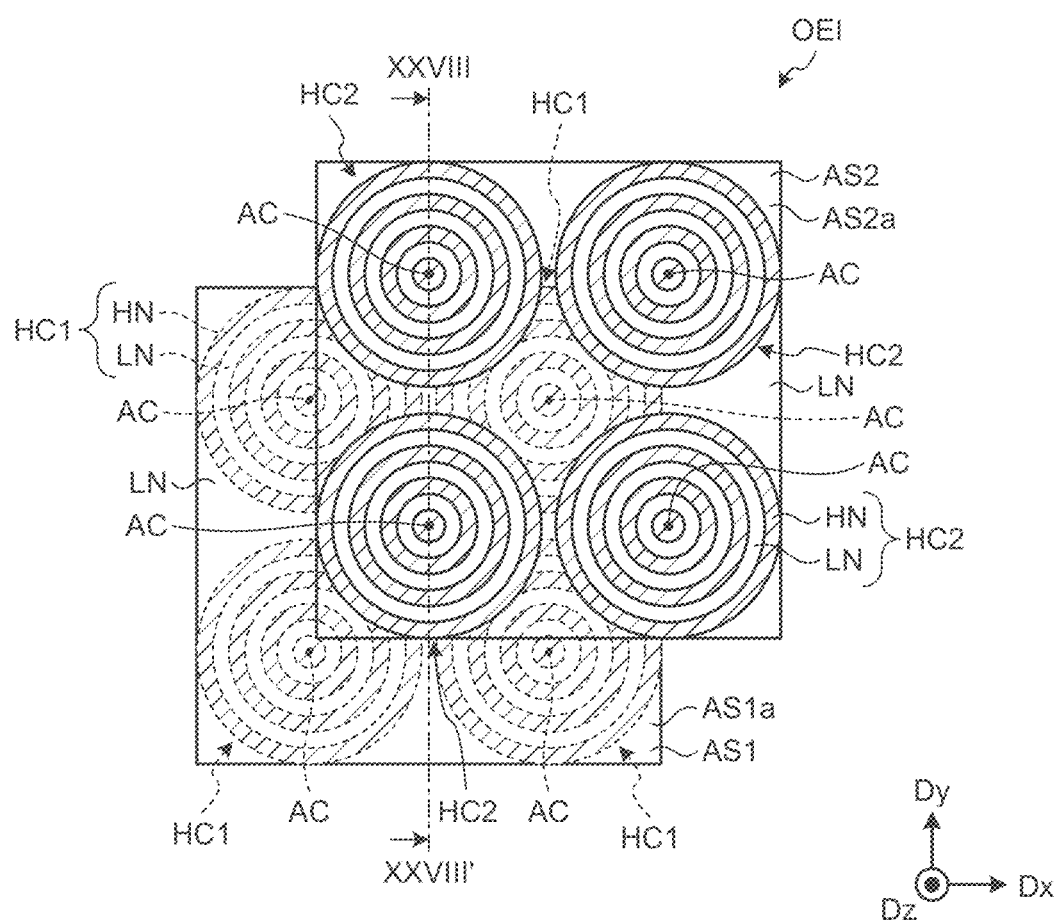
FIG. 27 is a plan view schematically illustrating an optical member according to a fifth modification of the sixth embodiment.

FIG. 27 is a plan view schematically illustrating an optical member according to a fifth modification of the sixth embodiment. In FIG. 27, the second light diffusion structures HC1 of the first light diffusion layer AS1 are represented by the dotted lines. An optical member OEI according to the fifth modification is different from the optical members OEG and OEH according to the sixth embodiment and the fourth modification in that the second light diffusion structures HC2 of the second light diffusion layer AS2 are shifted in both the first direction Dx and the second direction Dy with respect to the second light diffusion structures HC1 of the first light diffusion layer AS1.

Specifically, as illustrated in FIG. 27, the second light diffusion structures HC1 are disposed in a matrix (row-column configuration) on the first surface AS1a of the first light diffusion layer AS1. The second light diffusion structures HC2 are disposed in a matrix (row-column configuration) on the first surface AS2a of the second light diffusion layer AS2. The positions of the second light diffusion structures HC2 of the second light diffusion layer AS2 in the first direction Dx are deviated from the positions of the second light diffusion structures HC1 of the first light diffusion layer AS1 in the first direction Dx. The positions of the second light diffusion structures HC2 of the second light diffusion layer AS2 in the second direction Dy are deviated from the positions of the second light diffusion structures HC1 of the first light diffusion layer AS1 in the second direction Dy.

The center AC of the second light diffusion structure HC2 is positioned at a region surrounded by the centers AC of four second light diffusion structures HC1 in planar view. More specifically, the center AC of the second light diffusion structure HC2 is disposed at a position not overlapping the four second light diffusion structures HC1. Similarly, the center AC of the second light diffusion structure HC1 is disposed at a position not overlapping four second light diffusion structures HC2.

Figure 28:
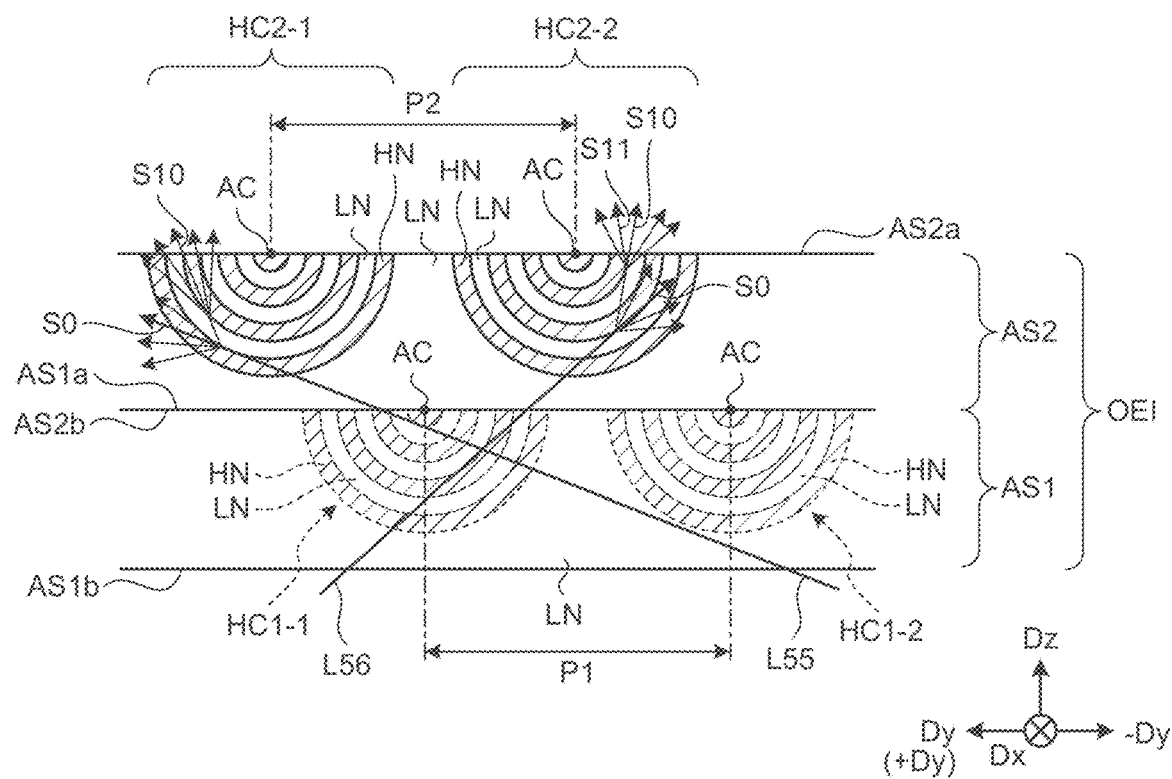
FIG. 28 is a cross-sectional view along line XXVIII-XXVIII' of FIG. 27.

FIG. 28 is a cross-sectional view along line XXVIII-XXVIII' of FIG. 27. The XXVIII-XXVIII' cross section in FIG. 28 is a cross section along a plane passing between the second light diffusion structures HC1 of the first light diffusion layer AS1 and passing through the centers AC of two second light diffusion structures HC2 arranged in the second direction Dy of the second light diffusion layer AS2. In FIG. 28, the second light diffusion structures HC1 positioned behind the XXVIII-XXVIII' cross section in the first direction Dx are represented by the dotted lines.

As illustrated in FIG. 28, both light L55 and light L56 traveling at high polar angles do not pass through any second light diffusion structure HC1 of the first light diffusion layer AS1 but pass through the low refractive index layer LN between the second light diffusion layers HC1. As a result, the light L55 and the light L56 pass through the first light diffusion layer AS1 without being scattered thereby. The second light diffusion structures HC2 of the second light diffusion layer AS2 according to the fifth modification are shifted in the first direction Dx and the second direction Dy with respect to the second light diffusion structures HC1.

With this structure, the light L55 and the light L56 are incident on and scattered by the second light diffusion structures HC2.

As described above, the second light diffusion structures HC2 of the second light diffusion layer AS2 according to the fifth modification are provided overlapping a region (low refractive index layer LN) between the second light diffusion structures HC1 of the first light diffusion layer AS1 in planar view. In other words, this configuration has higher arrangement density of the second light diffusion structures HC1 and HC2. With this configuration, the optical member OEI can scatter the light L55 and the light L56 traveling at high polar angles with any one of the second light diffusion structures HC1 and HC2. Consequently, the optical member OEI can increase the relative amount of light in the third direction Dz.

7. Seventh Embodiment

Figure 29:
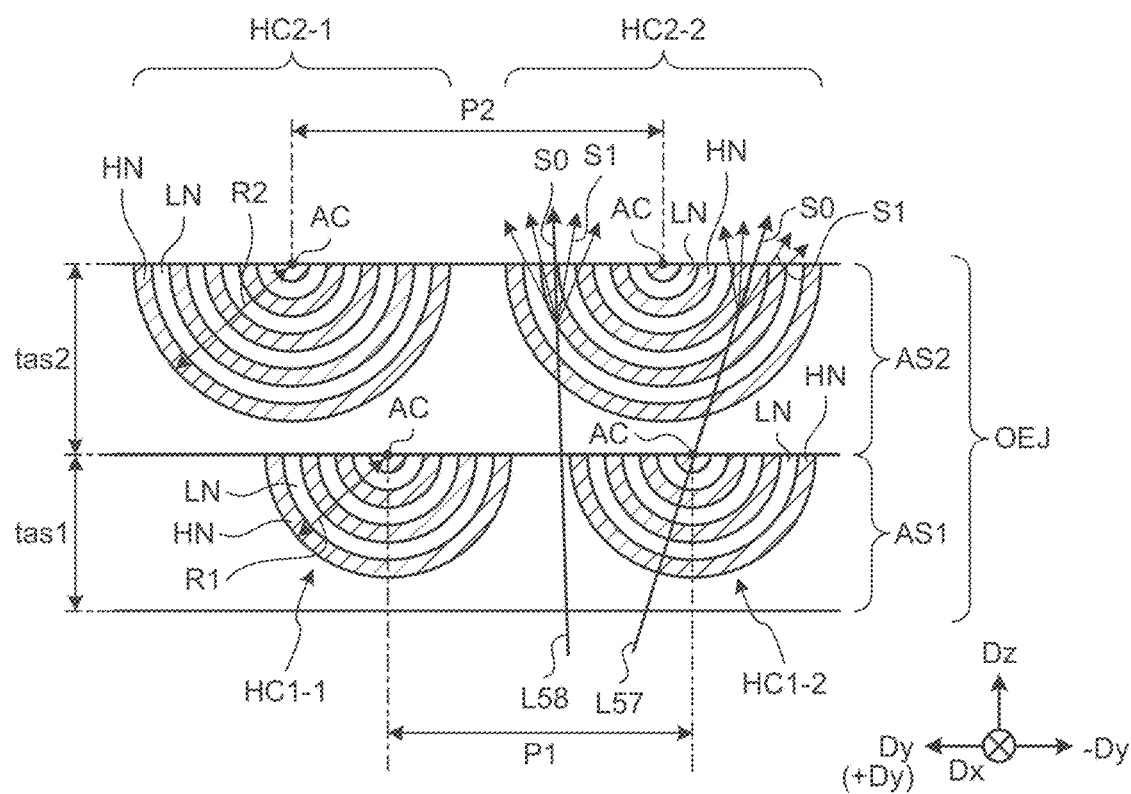
FIG. 29 is a cross-sectional view schematically illustrating an optical member according to a seventh embodiment.

FIG. 29 is a cross-sectional view schematically illustrating an optical member according to a seventh embodiment. As illustrated in FIG. 29, an optical member OEJ according to the seventh embodiment has the same cross-sectional configuration as the optical member OED according to the fourth embodiment. In other words, the size of the second light diffusion structure HC1 of the first light diffusion layer AS1 is different from that of the second light diffusion structure HC2 of the second light diffusion layer AS2.

The radius R2 of the second light diffusion structures HC2-1 and HC2-2 on the cross section of the second light diffusion layer AS2 is different from the radius R1 of the second light diffusion structures HC1-1 and HC1-2 on the cross section of the first light diffusion layer AS1. Specifically, the radius R2 of the second light diffusion structures HC2-1 and HC2-2 is greater than the radius R1 of the second light diffusion structures HC1-1 and HC1-2. The thickness tas2 of the second light diffusion layer AS2 is greater than the thickness tas1 of the first light diffusion layer AS1.

The arrangement pitch P2 between the second light diffusion structures HC2-1 and HC2-2 of the second light diffusion layer AS2 is different from the arrangement pitch P1 between the second light diffusion structures HC1-1 and HC1-2 of the first light diffusion layer AS1. The arrangement pitch P2 according to the present embodiment is greater than the arrangement pitch P1.

With this configuration, at least part of the second light diffusion structures HC2-1 and HC2-2 of the second light diffusion layer AS2 is provided at a position not overlapping the second light diffusion structures HC1-1 and HC1-2 of the first light diffusion layer AS1. As a result, light is more likely to be scattered by any one of the second light diffusion structures HC of the first light diffusion layer AS1 and the second light diffusion layer AS2 than in a case where the second light diffusion structures HC1-1, HC1-2, HC2-1, and HC2-2 of the first light diffusion layer AS1 and the second light diffusion layer AS2 have the same size and the same arrangement pitch.

Light L57 and light L58 having passed through the first light diffusion layer AS1 without being scattered thereby, for example, are scattered by the second light diffusion structure HC2-2 of the second light diffusion layer AS2, thereby increasing the components of the scattered light S1 traveling in the third direction Dz. Consequently, the present embodiment can increase the relative amount of light in the third direction Dz.

While FIG. 29 illustrates the cross-sectional view along a plane defined by the second direction Dy and the third direction Dz, the cross-sectional view along a plane defined by the first direction Dx and the third direction Dz has the same configuration as that illustrated in FIG. 29. In other words, the arrangement pitch between the second light diffusion structures HC2-1 and HC2-2 is different from that between the second light diffusion structures HC1-1 and HC1-2 also in the first direction Dx. In a manner similar to the light L57 traveling at an azimuth angle in the second direction Dy, light traveling at an azimuth angle in the first direction Dx can also be scattered by any one of the second light diffusion structures HC of the first light diffusion layer AS1 and the second light diffusion layer AS2.

The size relation between the radii of the second light diffusion structures HC may be reversed. In other words, the radius R2 of the second light diffusion structures HC2-1 and HC2-2 may be less than the radius R1 of the second light diffusion structures HC1-1 and HC1-2. The size relation between the arrangement pitch P1 and the arrangement pitch P2 may be reversed. In other words, the arrangement pitch P1 may be greater than the arrangement pitch P2.

The high refractive index layers HN and low refractive index layers LN included in the second light diffusion structures HC of the second light diffusion layer AS2 are equal in thickness to those included in the second light diffusion structures HC of the first light diffusion layer AS1, but different therefrom in number. The present embodiment is not limited thereto, and the high refractive index layers HN and the low refractive index layers LN included in the first light diffusion layer AS1 may be different in thickness from those included in the second light diffusion layer AS2. The arrangement pitches P1 and P2 may be the same between the first light diffusion layer AS1 and the second light diffusion layer AS2, and the radii R1 and R2 may be different therebetween. Alternatively, the radii R1 and R2 may be the same between the first light diffusion layer AS1 and the second light diffusion layer AS2, and the arrangement pitches P1 and P2 may be different therebetween.

8. Eighth Embodiment

Figure 30:
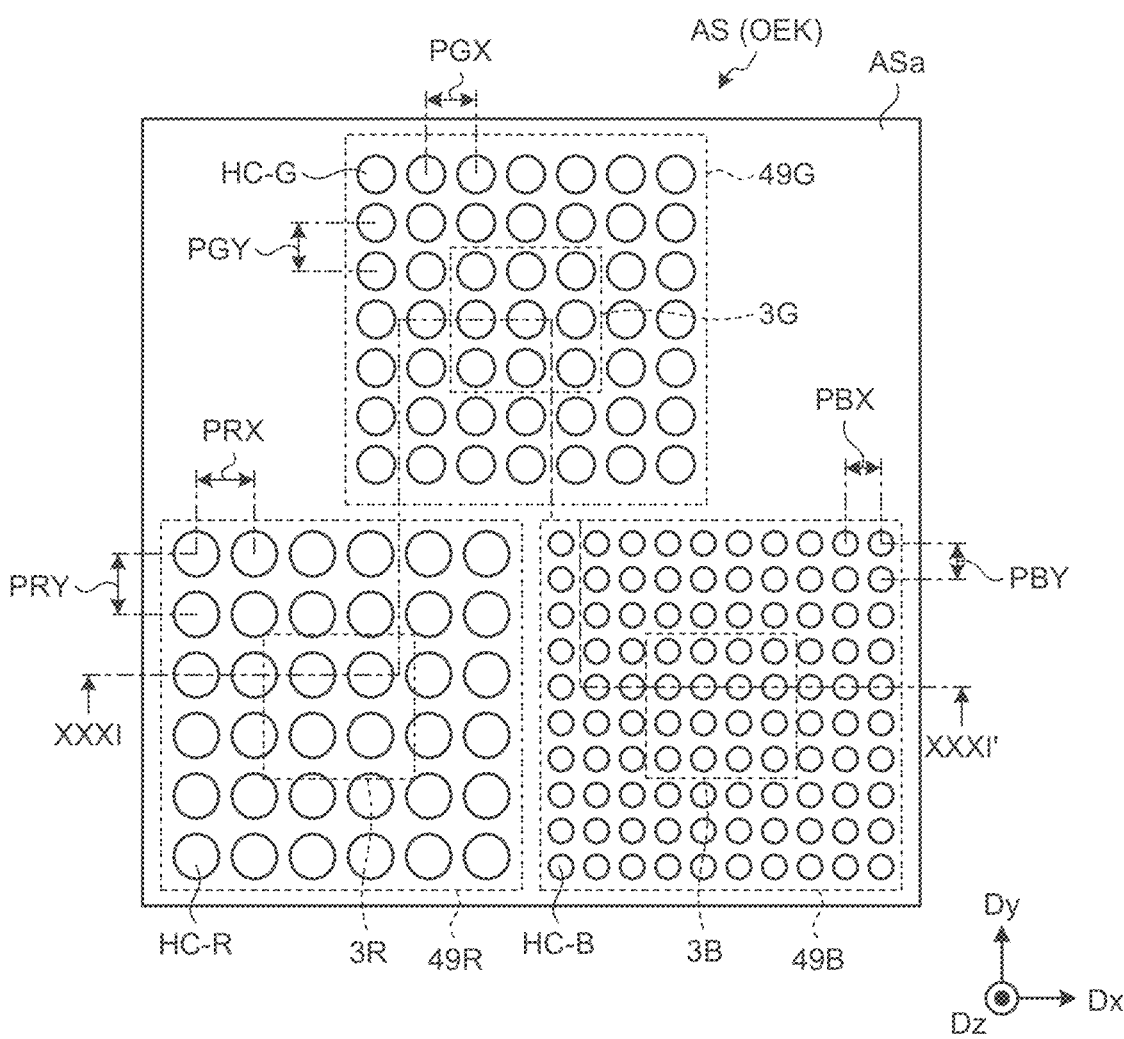
FIG. 30 is a plan view schematically illustrating an optical member according to an eighth embodiment.

FIG. 30 is a plan view schematically illustrating an optical member according to an eighth embodiment. FIG. 30 indicates the sub-pixels 49 and the light emitting elements 3 by the dotted lines and illustrates the positional relation between the second light diffusion structures HC and the sub-pixels 49 (light emitting elements 3). In an optical member OEK according to the eighth embodiment, the sizes, the arrangement pitches, and the layer pitches of the second light diffusion structures HC are different in a plane of one light diffusion layer AS.

Specifically, as illustrated in FIG. 30, the first sub-pixel 49R, the second sub-pixel 49G, and the third sub-pixel 49B are disposed in a triangular grid. The light emitting elements 3R, 3G, and 3B are disposed in a triangular grid corresponding to the first sub-pixel 49R, the second sub-pixel 49G, and the third sub-pixel 49B. Second light diffusion structures HC-R are provided in a region overlapping the first sub-pixel 49R and the light emitting element 3R. Second light diffusion structures HC-G are provided in a region overlapping the second sub-pixel 49G and the light emitting element 3G. Second light diffusion structures HC-B are provided in a region overlapping the third sub-pixel 49B and the light emitting element 3B. The second light diffusion structures HC-R, HC-G, and HC-B are each disposed in a matrix (row-column configuration).

While the second light diffusion structures HC-R, HC-G, and HC-B are schematically illustrated in FIG. 30, they each include the high refractive index layers HN and the low refractive index layers LN layered in a concentric hemispherical shape in a similar manner to the embodiments above.

The size (radius) of the second light diffusion structure HC-G is smaller than that of the second light diffusion structure HC-R. The size (radius) of the second light diffusion structure HC-B is smaller than that of the second light diffusion structure HC-G. In other words, the size (radius) decreases in order of the second light diffusion structures HC-R, HC-G, and HC-B.

An arrangement pitch PGX between the second light diffusion structures HC-G in the first direction Dx is less than an arrangement pitch PRX between the second light diffusion structures HC-R in the first direction Dx. An arrangement pitch PBX between the second light diffusion structures HC-B in the first direction Dx is less than the arrangement pitch PGX between the second light diffusion structures HC-G in the first direction Dx. In other words, the arrangement pitch decreases in order of the arrangement pitches PRX, PGX, and PBX.

An arrangement pitch PGY between the second light diffusion structures HC-G in the second direction Dy is less than an arrangement pitch PRY between the second light diffusion structures HC-R in the second direction Dy. An arrangement pitch PBY between the second light diffusion structures HC-B in the second direction Dy is less than the arrangement pitch PGY between the second light diffusion structures HC-G in the second direction Dy. In other words, the arrangement pitch decreases in order of the arrangement pitches PRY, PGY, and PBY. The arrangement density (number) per unit area increases in order of the second light diffusion structures HC-R, HC-G, and HC-B. Specifically, the number of second light diffusion structures HC overlapping the light emitting elements 3R, 3G, and 3B increases in order of the second light diffusion structures HC-R, HC-G, and HC-B.

Figure 31:
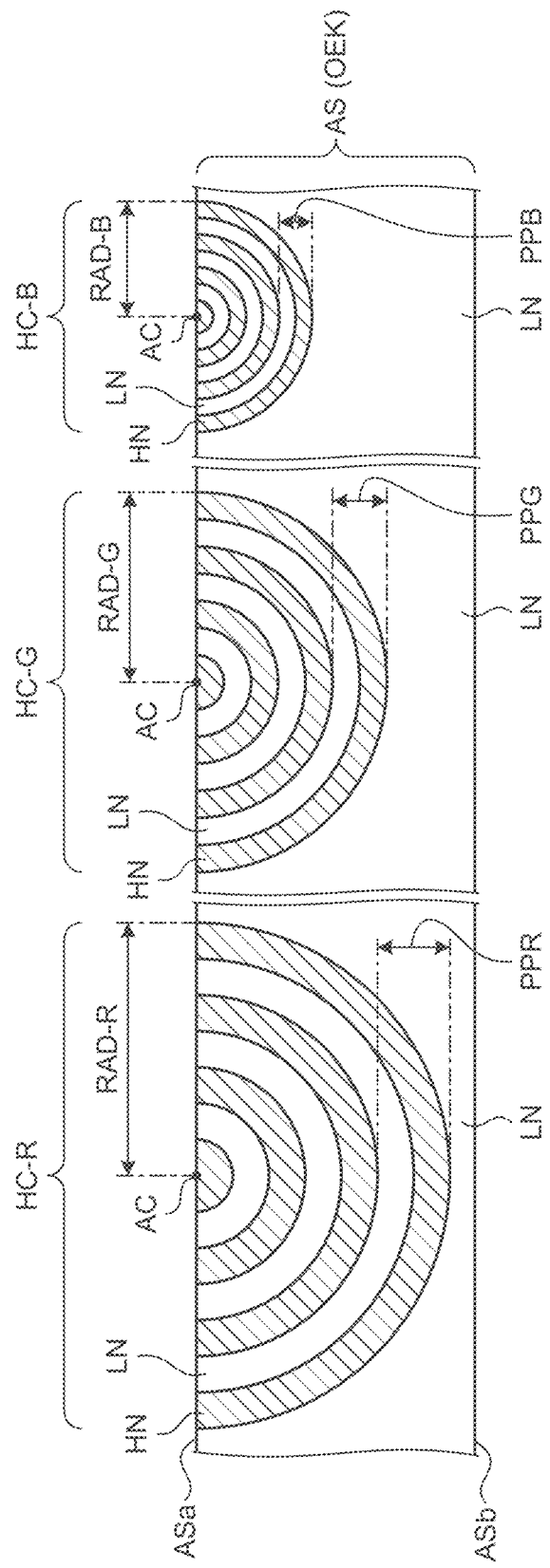
FIG. 31 is a cross-sectional view along line XXXI-XXXI' of FIG. 30.

FIG. 31 is a cross-sectional view along line XXXI-XXXI' of FIG. 30. In FIG. 31, the second light diffusion structures HC-R, HC-G, and HC-B are disposed one by one. As illustrated in FIG. 31, the second light diffusion structures HC-R, HC-G, and HC-B are provided in the same light diffusion layer AS. A layer pitch PPG of the high refractive index layer HN and the low refractive index layer LN of the second light diffusion structure HC-G is less than a layer pitch PPR of the high refractive index layer HN and the low refractive index layer LN of the second light diffusion structure HC-R. A layer pitch PPB of the high refractive index layer HN and the low refractive index layer LN of the second light diffusion structure HC-B is less than the layer pitch PPG of the high refractive index layer HN and the low refractive index layer LN of the second light diffusion structure HC-G. The layer pitch decreases in order of the layer pitches PPR, PPG, and PPB. In other words, the thickness of the high refractive index layer HN and the low refractive index layer LN decreases in order of the second light diffusion structures HC-R, HC-G, and HC-B.

The number of high refractive index layers HN and the number of low refractive index layers LN are the same between the second light diffusion structures HC-R, HC-G, and HC-B. As a result, the radius of the second light diffusion structure HC decreases in order of a radius RAD-R of the second light diffusion structure HC-R, a radius RAD-G of the second light diffusion structure HC-G, and a radius RAD-B of the second light diffusion structure HC-B. The number of high refractive index layers HN and the number of low refractive index layers LN may be different between the second light diffusion structures HC-R, HC-G, and HC-B.

The centers AC of the second light diffusion structures HC-R, HC-G, and HC-B are positioned on the first surface ASa of the light diffusion layer AS. In other words, the distance from the lower end of the outermost high refractive index layer HN and the second surface ASb of the light diffusion layer AS in the thickness direction of the light diffusion layer AS increases in order of the second light diffusion structures HC-R, HC-G, and HC-B.

As described above, the layer pitch PPR of the second light diffusion structure HC-R is made large corresponding to the light emitting element 3R having the longest wavelength in the light emitting elements 3R, 3G, and 3B. The layer pitch PPB of the second light diffusion structure HC-B is made small corresponding to the light emitting element 3B having the shortest wavelength. The layer pitch PPG of the second light diffusion structure HC-G is made intermediate corresponding to the light emitting element 3G having the intermediate wavelength.

With the layer pitches PPR, PPG, and PPB varying depending on the wavelength of incident light, the second light diffusion structures HC-R, HC-G, and HC-B can efficiently scatter light having the respective wavelengths. With the different arrangement pitches PRX, PRY, PGX, PGY, PBX, and PBY, the second light diffusion structures HC-R, HC-G, and HC-B can efficiently scatter light having the respective wavelengths. Consequently, the optical member of the eighth embodiment can increase the relative amount of light in the third direction Dz compared with a case where the light emitting elements 3R, 3G, and 3B are provided with the second light diffusion structures HC having the same configuration.

The second light diffusion structures HC having the different layer pitches PPR, PPG, and PPB can be produced in the same plane by changing the wavelength of light emitted to the photoreactive organic film POR (refer to FIG. 10). The gap between interference patterns is proportional to the wavelength of light. Irradiation with light having a longer wavelength can form a concentric hemispherical structure having a larger layer pitch. Irradiation with light having a shorter wavelength can form a concentric hemispherical structure having a smaller layer pitch.

To create the light diffusion layer AS using light having wavelengths of different visible light regions, a solid-phase hologram may be used for the light diffusion layer AS. The solid-phase hologram is obtained by dispersing a photoreactive monomer, an initiator, and a sensitizing dye in an organic polymer. A solid-phase hologram material made by Polaroid Corporation, for example, uses polyvinylpyrrolidone as the organic polymer, acrylamide, lithium acrylate, or methylenebisacrylamide as the photoreactive monomer, polyethylenimine as the initiator, and methylene blue as the sensitizing dye and has photosensitivity in a wide visible region including red, green, and blue. By masking the solid-phase hologram and irradiating it with light through the openings AP, concentric hemispherical structures created by light sources in the respective colors of red, green, and blue can be distributed in the light diffusion layer AS.

More specifically, after causing an organic polymer film to absorb moisture and appropriately swell, the concentric hemispherical structures are created corresponding to the red, green, and blue light emitting elements 3R, 3G, and 3B. The organic polymer film is then wholly exposed to white light to finish the progress of photoreaction. Subsequently, the organic polymer film is immersed in a zirconium acetate alcoholic solution and washed with propanol for higher humidity resistance and stabilization.

The first sub-pixel 49R, the second sub-pixel 49G, the third sub-pixel 49B, and the light emitting elements 3R, 3G, and 3B do not necessarily disposed in a triangular grid. They may be disposed in another form like the first sub-pixel 49R, the second sub-pixel 49G, and the third sub-pixel 49B are arranged in the first direction Dx. If the light emitting elements 3 emit four or more colors, the second light diffusion structures HC can have different configurations depending on the wavelength of light. The configuration according to the present embodiment can be combined with the configurations according to the fifth to the seventh embodiments and the modifications thereof.

9. Ninth Embodiment

Figure 32:
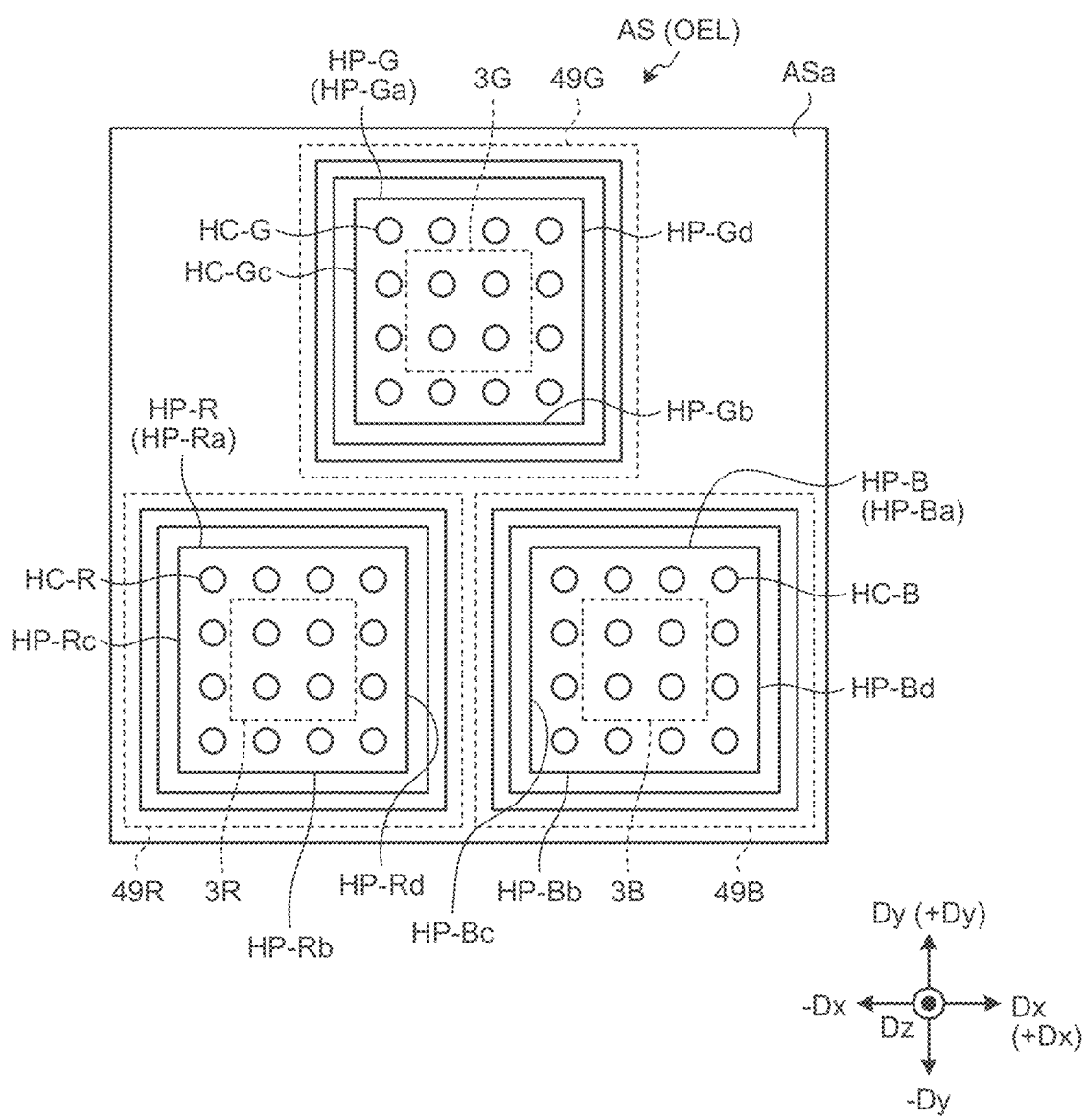
FIG. 32 is a plan view schematically illustrating an optical member according to a ninth embodiment.

FIG. 32 is a plan view schematically illustrating an optical member according to a ninth embodiment. As illustrated in FIG. 32, an optical member OEL according to the ninth embodiment includes the first light diffusion structures HP having a concentric semicylindrical structure and the second light diffusion structures HC having a concentric hemispherical structure in a plane of one light diffusion layer AS.

The second light diffusion structures HC-R, HC-G, and HC-B are disposed in a matrix (row-column configuration) in a region on or near the light emitting elements 3R, 3G, and 3B, respectively. The first light diffusion structures HP-R, HP-G, and HP-B are disposed away from the light emitting elements 3R, 3G, and 3B, respectively. The first light diffusion structure HP-R is provided surrounding the light emitting element 3R and the second light diffusion structures HC-R. The first light diffusion structure HP-G is provided surrounding the light emitting element 3G and the second light diffusion structures HC-G. The first light diffusion structure HP-B is provided surrounding the light emitting element 3B and the second light diffusion structures HC-B.

The first light diffusion structures HP-R, HP-G, and HP-B each have a square shape. The first light diffusion structure HP-R includes a first part HP-Ra, a second part HP-Rb, a third part HP-Rc, and a fourth part HP-Rd. The first light diffusion structure HP-G includes a first part HP-Ga, a second part HP-Gb, a third part HP-Gc, and a fourth part HP-Gd. The first light diffusion structure HP-B includes a first part HP-Ba, a second part HP-Bb, a third part HP-Bc, and a fourth part HP-Bd.

The following describes the configuration of the first light diffusion structure HP-R. Explanation of the first light diffusion structure HP-R is applicable to the first light diffusion structures HP-G and HP-B. The first part HP-Ra, the second part HP-Rb, the third part HP-Rc, and the fourth part HP-Rd are provided parallel to the respective sides of the light emitting element 3R. The first part HP-Ra and the second part HP-Rb extend in the first direction Dx. The second light diffusion structures HC-R are disposed between the first part HP-Ra and the second part HP-Rb arranged in the second direction Dy. The third part HP-Rc and the fourth part HP-Rd extend in the second direction Dy. The second light diffusion structures HC-R are disposed between the third part HP-Rc and the fourth part HP-Rd arranged in the first direction Dx.

The ends of the first part HP-Ra, the second part HP-Rb, the third part HP-Rc, and the fourth part HP-Rd are coupled, thereby forming the first light diffusion structure HP-R in a square shape. The first light diffusion structure HP-R does not necessarily have a closed ring shape, and at least part of the first part HP-Ra, the second part HP-Rb, the third part HP-Rc, and the fourth part HP-Rd may be separately disposed. While three first light diffusion structures HP-R are provided surrounding the light emitting element 3R and the second light diffusion structures HC-R, the present embodiment is not limited thereto. The number of first light diffusion structures HP-R may be four or more or two or less.

In the region on or near the light emitting element 3R, the azimuth angle range of light emitted from the light emitting element 3R and incident on the light diffusion layer AS is wide. Especially on the light emitting element 3R, light is incident on the light diffusion layer AS from all azimuth angle directions. Also in this case, the second light diffusion structures HC-R having a concentric hemispherical structure can scatter light incident from all azimuth angles.

By contrast, in a region away from the light emitting element 3R, the azimuth angle range of light incident on the light diffusion layer AS is relatively narrow. On the first part HP-Ra, light traveling at an azimuth angle in the second direction Dy (+Dy direction) is incident. On the second part HP-Rb, light traveling at an azimuth angle in the second direction Dy (-Dy direction) is incident. On the third part HP-Rc, light traveling at an azimuth angle in the first direction Dx (-Dx direction) is incident. On the fourth part HP-Rd, light traveling at an azimuth angle in the first direction Dx (+Dx direction) is incident. With the extension directions of the respective parts of the first light diffusion structure HP-R appropriately determined corresponding to the azimuth angles of incident light, the first light diffusion structure HP-R can efficiently scatter light.

The shape of the first light diffusion structure HP in planar view is not limited to a square and may be a triangle, a hexagon, a circular arc, or the like. The first light diffusion structures HP and the second light diffusion structures HC are not necessarily provided in the same light diffusion layer AS and may be separately provided in the first light diffusion layer AS1 and the second light diffusion layer AS2. The configuration according to the present embodiment can be combined with the configurations according to the fifth to the ninth embodiments and the modifications thereof.

10. Tenth Embodiment

Figure 33:
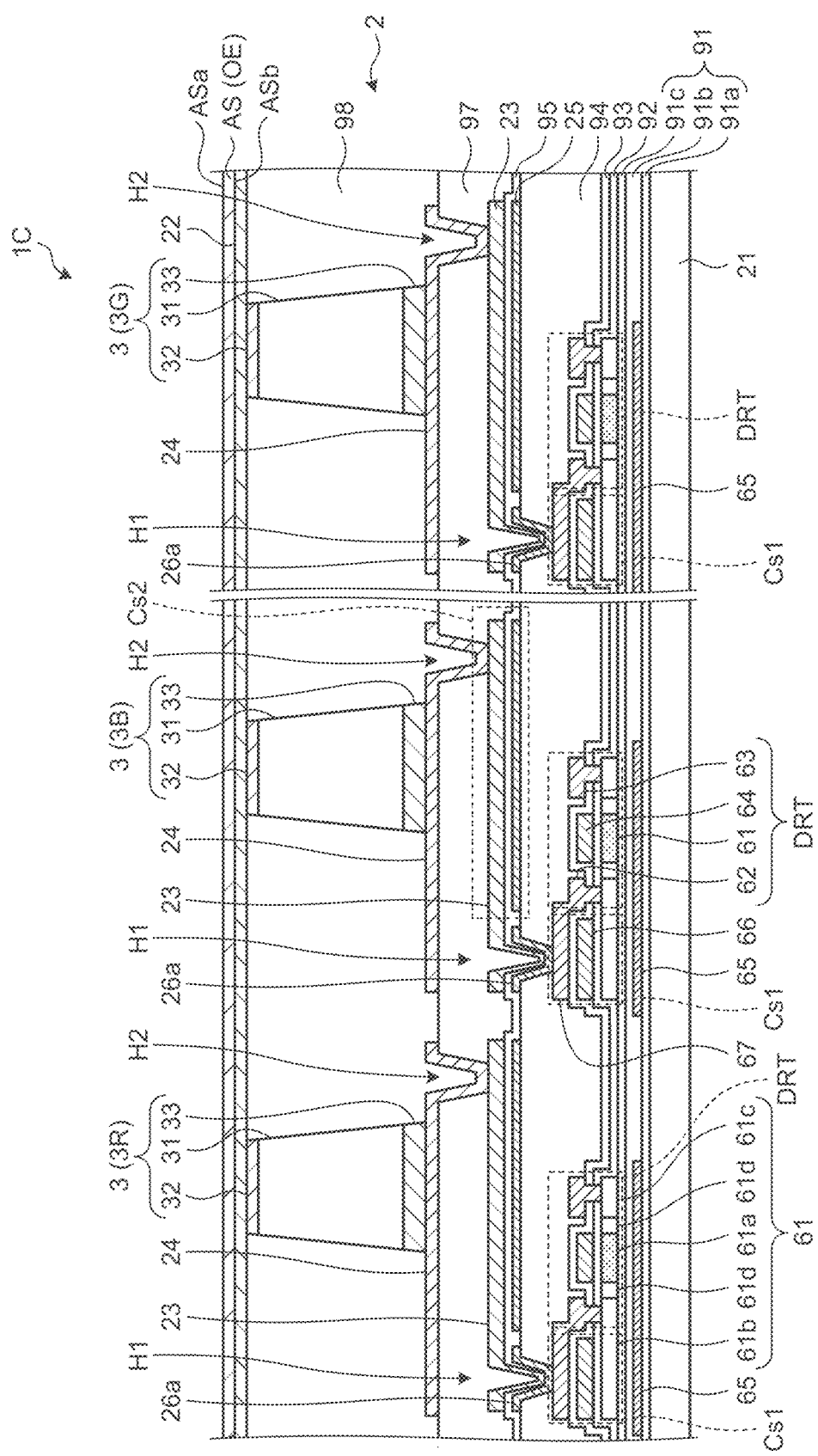
FIG. 33 is a cross-sectional view schematically illustrating a display device according to a tenth embodiment.

FIG. 33 is a cross-sectional view schematically illustrating a display device according to a tenth embodiment. As illustrated in FIG. 33, the optical member OE of a display device 1C according to the tenth embodiment is provided on the cathode electrode 22. In other words, the optical member OE is provided directly on the cathode electrode 22 without the overcoat layer OC (refer to FIG. 5) interposed therebetween. Without the overcoat layer OC, the display device of the present embodiment can increase the amount of light incident on the optical member OE compared with the first embodiment.

The optical members OE and OEA to OEL according to the first to the ninth embodiments and the modifications described above can be used as the optical member OE illustrated in FIG. 33.

While exemplary embodiments according to the present disclosure have been described, the embodiments are not intended to limit the disclosure. The contents disclosed in the embodiments are given by way of example only, and various changes may be made without departing from the spirit of the present disclosure. Appropriate changes made without departing from the spirit of the present disclosure naturally fall within the scope of the disclosure. At least one of various omissions, substitutions, and changes of the components may be made without departing from the spirit of the embodiments above and the modification thereof.

What is claimed is:

1. A display device comprising:
a substrate;
a plurality of pixels provided to the substrate;
a plurality of light emitting elements provided to the pixels; and
a first light diffusion layer including a plurality of light diffusion structures and having a first surface and a second surface opposite to the first surface, the second surface facing the substrate with the light emitting elements interposed between the second surface and the substrate, wherein
the light diffusion structures each include a plurality of high refractive index layers and a plurality of low refractive index layers,
the high refractive index layers and the low refractive index layers are alternately layered in a thickness direction of the first light diffusion layer, and
the high refractive index layers and the low refractive index layers are each curved and recessed in a direction from the first surface toward the second surface.

2. The display device according to claim 1, wherein the high refractive index layers and the low refractive index layers in each of the light diffusion structures are layered in a concentric semicylindrical shape.

3. The display device according to claim 2, wherein, on the first surface of the first light diffusion layer, the high refractive index layers and the low refractive index layers in each of the light diffusion structures are alternately arrayed in a first direction and each extend in a second direction intersecting the first direction.

4. The display device according to claim 3, wherein the light diffusion structures are arranged in the first direction and each extend in the second direction.

5. The display device according to claim 2, further comprising a second light diffusion layer layered on the first light diffusion layer, wherein
the second light diffusion layer includes a plurality of light diffusion structures, and
the light diffusion structures of the second light diffusion layer each include high refractive index layers and low refractive index layers layered in a concentric semicylindrical shape.

6. The display device according to claim 5, wherein the light diffusion structures of the second light diffusion layer extend in a direction parallel to an extension direction of the light diffusion structures of the first light diffusion layer and are disposed overlapping the light diffusion structures of the first light diffusion layer.

7. The display device according to claim 5, wherein the light diffusion structures of the second light diffusion layer extend in a direction parallel to an extension direction of the light diffusion structures of the first light diffusion layer, and at least part of the light diffusion structures of the second light diffusion layer are disposed at a position not overlapping the light diffusion structures of the first light diffusion layer.

8. The display device according to claim 5, wherein the light diffusion structures of the second light diffusion layer extend in a direction different from an extension direction of the light diffusion structures of the first light diffusion layer.

9. The display device according to claim 8, wherein
the light diffusion structures of the first light diffusion layer extend in a direction parallel to a first side of a display region, and the light diffusion structures of the second light diffusion layer extend in a direction parallel to a second side intersecting the first side of the display region.

10. The display device according to claim 5, wherein an arrangement pitch between the light diffusion structures of the second light diffusion layer is different from an arrangement pitch between the light diffusion structures of the first light diffusion layer.

11. The display device according to claim 5, wherein a radius of the light diffusion structures on a cross section of the second light diffusion layer is different from a radius of the light diffusion structures on a cross section of the first light diffusion layer.

12. The display device according to claim 1, wherein the high refractive index layers and the low refractive index layers in each of the light diffusion structures are layered in a concentric hemispherical shape.

13. The display device according to claim 12, wherein the high refractive index layers and the low refractive index layers in each of the light diffusion structures are concentrically and alternately disposed on the first surface of the first light diffusion layer.

14. The display device according to claim 12, wherein the light diffusion structures are disposed in a matrix on the first surface of the first light diffusion layer.

15. The display device according to claim 12, wherein the light diffusion structures are disposed in a triangular grid on the first surface of the first light diffusion layer.

16. The display device according to claim 12, further comprising a second light diffusion layer layered on the first light diffusion layer, wherein
the second light diffusion layer includes a plurality of light diffusion structures, and
the light diffusion structures of the second light diffusion layer each include high refractive index layers and low refractive index layers layered in a concentric hemispherical shape.

17. The display device according to claim 16, wherein the light diffusion structures of the second light diffusion layer are disposed overlapping the light diffusion structures of the first light diffusion layer.

18. The display device according to claim 16, wherein at least part of the light diffusion structures of the second light diffusion layer are disposed at a position not overlapping the light diffusion structures of the first light diffusion layer.

19. The display device according to claim 1, wherein
the pixels each include a first sub-pixel configured to display red, a second sub-pixel configured to display green, and a third sub-pixel configured to display blue, and
a layer pitch of the high refractive index layer and the low refractive index layer of the light diffusion structure in a region overlapping the second sub-pixel is less than a layer pitch of the high refractive index layer and the low refractive index layer of the light diffusion structure in a region overlapping the first sub-pixel.

20. The display device according to claim 1, wherein
the first light diffusion layer includes a plurality of first light diffusion structures in which high refractive index layers and low refractive index layers are layered in a concentric semicylindrical shape and a plurality of second light diffusion structures in which high refractive index layers and low refractive index layers are layered in a concentric hemispherical shape,
the second light diffusion structures are provided in a region overlapping the light emitting element, and
the first light diffusion structures are provided surrounding the second light diffusion structures.

* * * * *